(12) United States Patent
Liaw

(10) Patent No.: US 12,183,652 B2
(45) Date of Patent: Dec. 31, 2024

(54) INTEGRATED CIRCUIT STRUCTURE

(71) Applicant: TAIWAN SEMICONDUCTOR MANUFACTURING CO., LTD., Hsinchu (TW)

(72) Inventor: Jhon-Jhy Liaw, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 150 days.

(21) Appl. No.: 17/884,272

(22) Filed: Aug. 9, 2022

(65) Prior Publication Data
US 2022/0384303 A1      Dec. 1, 2022

Related U.S. Application Data

(60) Continuation of application No. 17/127,701, filed on Dec. 18, 2020, now Pat. No. 11,456,228, which is a continuation of application No. 16/449,915, filed on Jun. 24, 2019, now Pat. No. 10,872,839, which is a division of application No. 15/940,821, filed on Mar. 29, 2018, now Pat. No. 10,332,819.

(51) Int. Cl.
| | |
|---|---|
| *H01L 23/48* | (2006.01) |
| *H01L 23/367* | (2006.01) |
| *H01L 27/092* | (2006.01) |
| *H01L 29/417* | (2006.01) |
| *H01L 29/66* | (2006.01) |
| *H01L 29/78* | (2006.01) |
| *H01L 21/8238* | (2006.01) |
| *H01L 27/12* | (2006.01) |

(52) U.S. Cl.
CPC ........ *H01L 23/3677* (2013.01); *H01L 23/481* (2013.01); *H01L 27/0924* (2013.01); *H01L 29/41791* (2013.01); *H01L 29/66007* (2013.01); *H01L 29/785* (2013.01); *H01L 29/7856* (2013.01); *H01L 21/823821* (2013.01); *H01L 27/1211* (2013.01); *H01L 29/7855* (2013.01); *H01L 2029/7858* (2013.01)

(58) Field of Classification Search
CPC ............... H01L 23/3677; H01L 23/481; H01L 27/0924; H01L 29/41791; H01L 29/785; H01L 29/7856; H01L 21/823821; H01L 27/1211
See application file for complete search history.

(56) References Cited

U.S. PATENT DOCUMENTS

| | | |
|---|---|---|
| 7,859,044 B2 | 12/2010 | Wong et al. |
| 7,888,750 B2 | 2/2011 | Anderson et al. |

(Continued)

*Primary Examiner* — Nicholas J Tobergte
(74) *Attorney, Agent, or Firm* — Maschoff Brennan

(57) ABSTRACT

An IC structure includes a plurality of first fins, a plurality of second fins, a plurality of first gate structures, a plurality of second gate structures, and a first gate contact. The first fins and the second fins are over a substrate. The first gate structures traverse the plurality of first fins. The second gate structures traverse the plurality of second fins. The first gate structures have a first gate pitch. The second gate structures have a second gate pitch wider than the first gate pitch. The first gate contact is over a first one of the second gate structures. The first gate contact overlaps a location where the first one of the second gate structures traverses across a first one of the second fins.

20 Claims, 28 Drawing Sheets

(56) References Cited

U.S. PATENT DOCUMENTS

| | | | |
|---|---|---|---|
| 8,022,478 B2 | 9/2011 | Anderson et al. | |
| 9,646,974 B1* | 5/2017 | Liaw | G11C 11/412 |
| 9,893,064 B2 | 2/2018 | Chung | |
| 9,985,023 B1 | 5/2018 | Liu et al. | |
| 10,121,882 B1 | 11/2018 | Ho et al. | |
| 10,312,332 B2* | 6/2019 | Liaw | H01L 27/0886 |
| 10,332,819 B1 | 6/2019 | Liaw | |
| 10,879,174 B2* | 12/2020 | Liaw | H01L 21/76816 |
| 2005/0266677 A1 | 12/2005 | Hayashi | |
| 2009/0174000 A1* | 7/2009 | Ohguro | H01L 24/05 |
| | | | 257/734 |
| 2010/0202208 A1* | 8/2010 | Endo | H01L 29/41725 |
| | | | 257/369 |
| 2014/0167172 A1* | 6/2014 | Chen | H01L 29/6681 |
| | | | 257/296 |
| 2015/0004723 A1* | 1/2015 | Fan | H01L 22/12 |
| | | | 438/17 |
| 2015/0021625 A1 | 1/2015 | Utomo | |
| 2015/0372085 A1* | 12/2015 | Lee | H01L 29/4238 |
| | | | 257/288 |
| 2016/0351669 A1 | 12/2016 | Shiao | |
| 2016/0359008 A1* | 12/2016 | Choi | H01L 21/31111 |
| 2016/0359009 A1* | 12/2016 | Xie | H01L 29/66795 |
| 2018/0212058 A1* | 7/2018 | Toh | H10B 20/20 |
| 2018/0301559 A1* | 10/2018 | Liaw | H01L 29/66795 |
| 2019/0172823 A1* | 6/2019 | Chen | G06F 30/392 |
| 2019/0287902 A1* | 9/2019 | Liaw | H01L 23/5226 |
| 2019/0287967 A1* | 9/2019 | Liaw | H01L 21/823431 |

* cited by examiner

INTEGRATED CIRCUIT STRUCTURE

PRIORITY CLAIM AND CROSS-REFERENCE

The present application is a Continuation Application of the U.S. application Ser. No. 17/127,701, filed Dec. 18, 2020, which is a Continuation Application of the U.S. application Ser. No. 16/449,915, filed Jun. 24, 2019, now U.S. Pat. No. 10,872,839, issued Dec. 22, 2020, which is a Divisional Application of the U.S. application Ser. No. 15/940,821, filed Mar. 29, 2018, now U.S. Pat. No. 10,332,819, issued Jun. 25, 2019, all of which are herein incorporated by reference in their entireties.

BACKGROUND

As the technology nodes shrink, in some integrated circuit (IC) designs, there has been a desire to replace the typically polysilicon gate electrode with a metal gate electrode to improve device performance with the decreased feature sizes. One process of forming a metal gate structure is termed a "gate last" process in which the final gate structure is fabricated "last" which allows for reduced number of subsequent processes, including high temperature processing, that must be performed after formation of the gate. Additionally, as the dimensions of transistors decrease, the thickness of the gate oxide must be reduced to maintain performance with the decreased gate length. In order to reduce gate leakage, high-dielectric-constant (high-k) gate dielectric layers are also used which allow greater physical thicknesses while maintaining the same effective thickness as would be provided by a thinner layer of the gate oxide used in larger technology nodes.

However, there are challenges to implementing such features and processes in complementary metal-oxide-semiconductor (CMOS) fabrication. As the gate length and spacing between devices decrease, these problems are exacerbated. For example, source/drain regions may short to metal gate structures due to misalignment of contacts.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
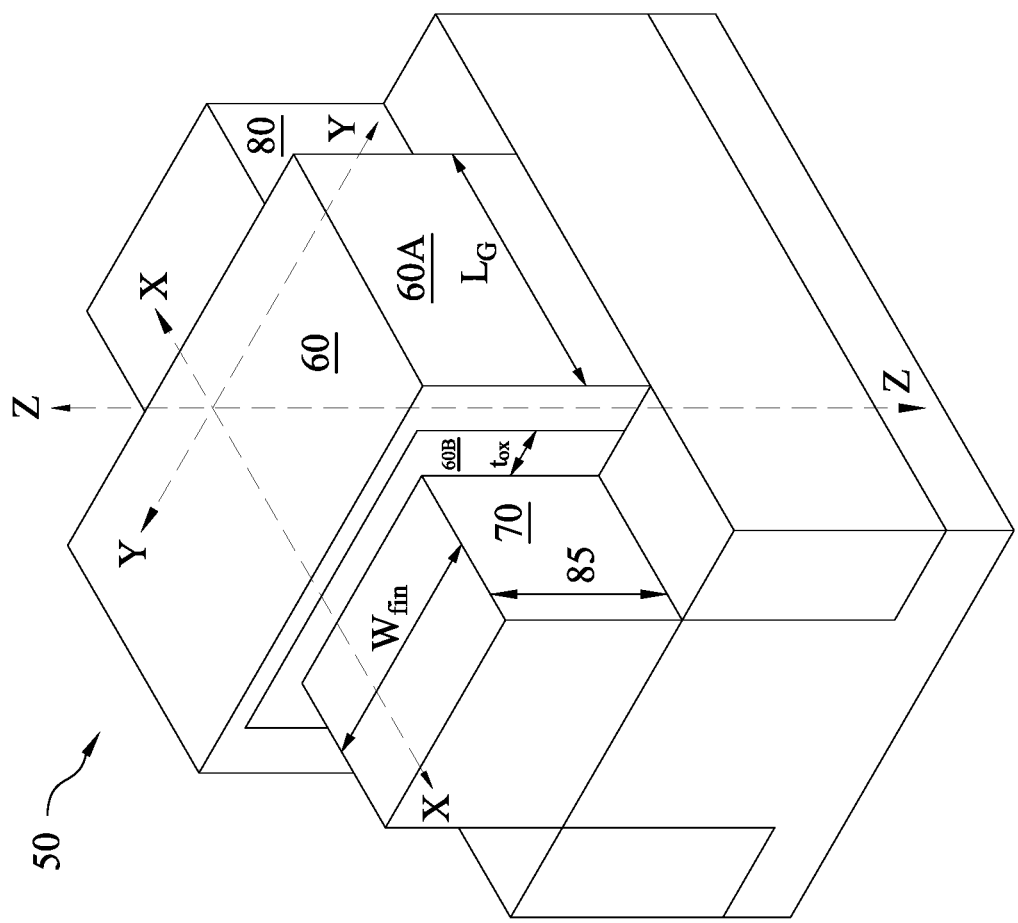
FIG. 1 illustrates a perspective view of an example FinFET device.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is directed to, but not otherwise limited to, a fin-like field-effect transistor (FinFET) device. The FinFET device, for example, may be a complementary metal-oxide-semiconductor (CMOS) device including a P-type metal-oxide-semiconductor (PMOS) FinFET device and an N-type metal-oxide-semiconductor (NMOS) FinFET device. The following disclosure will continue with one or more FinFET examples to illustrate various embodiments of the present disclosure. It is understood, however, that the application should not be limited to a particular type of device, except as specifically claimed.

The use of FinFET devices has been gaining popularity in the semiconductor industry. Referring to FIG. 1, which illustrates a perspective view of an example FinFET device 50. The FinFET device 50 is a non-planar multi-gate transistor that is built over a substrate (such as a bulk substrate). A thin silicon-containing "fin-like" structure (hereinafter referred to as a "fin") forms the body of the FinFET device 50. The fin extends along an X-direction shown in FIG. 1. The fin has a fin width $W_{fin}$ measured along a Y-direction that is orthogonal to the X-direction. In some embodiments, the fin width $W_{fin}$ of the fin may be defined as a width of the top surface of the fin measured along the Y-direction. A gate 60 of the FinFET device 50 wraps around this fin, for example around the top surface and the opposing sidewall surfaces of the fin. Thus, a portion of the gate 60 is located over the fin in a Z-direction that is orthogonal to both the X-direction and the Y-direction. $L_G$ denotes a length (or width, depending on the perspective) of the gate 60 measured in the X-direction. The gate 60 may include a gate electrode component 60A and a gate dielectric component 60B. The gate dielectric 60B has a thickness $t_{ox}$ measured in the Y-direction. A portion of the gate 60 is located over a dielectric isolation structure such as shallow trench isolation (STI). A source 70 and a drain 80 of the FinFET device 50 are formed in extensions of the fin on opposite sides of the gate 60. A portion of the fin being wrapped around by the gate 60 serves as a channel of the FinFET device 50. The effective channel length of the FinFET device 50 is determined by the dimensions of the fin.

Figure 2:
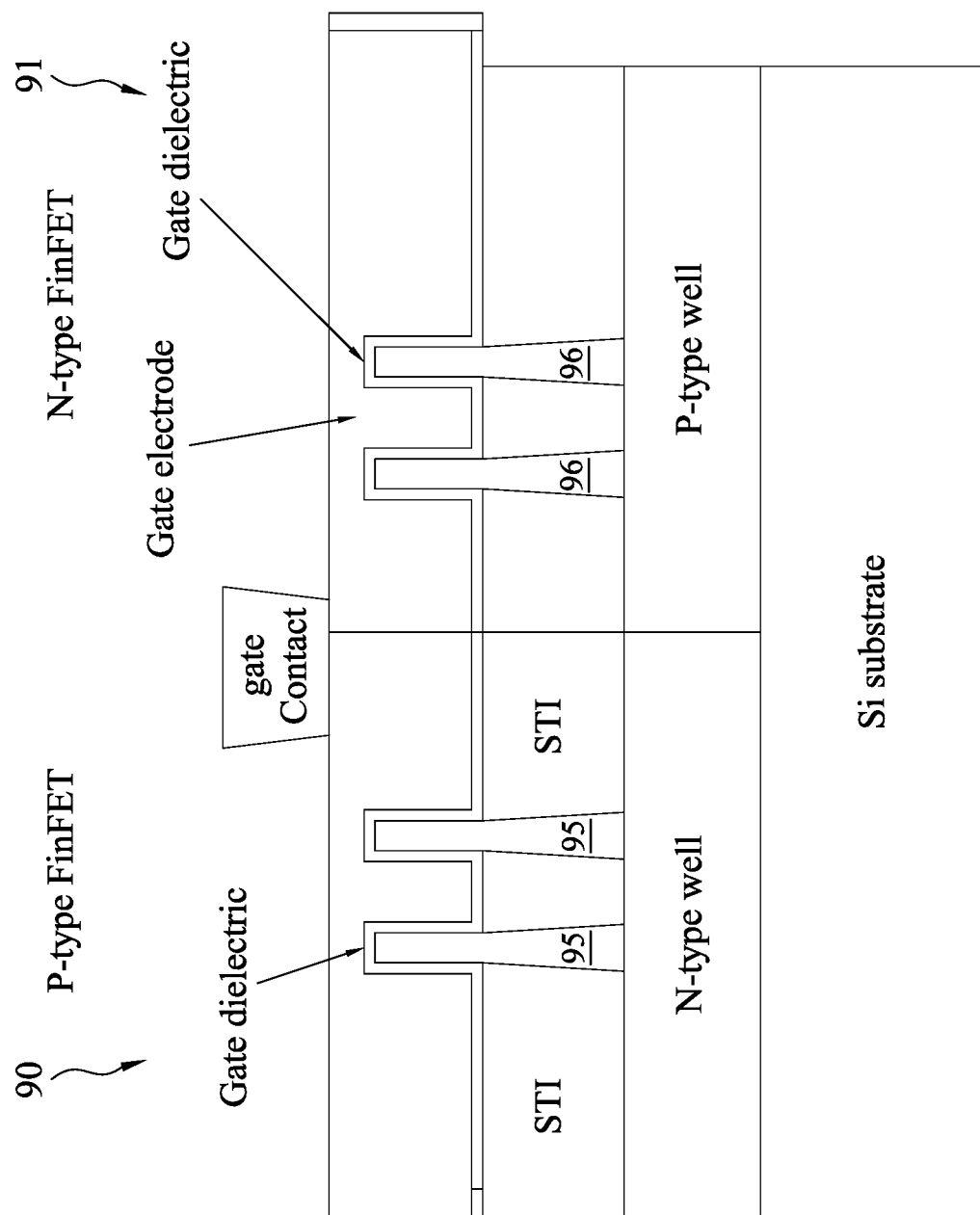
FIG. 2 illustrates a diagrammatic cross-sectional side view of FinFET transistors in a CMOS configuration.

FIG. 2 illustrates a diagrammatic cross-sectional side view of FinFET transistors in a CMOS configuration. The CMOS FinFET includes a substrate, for example a silicon substrate. An N-type well and a P-type well are formed in the substrate. A dielectric isolation structure such as a shallow trench isolation (STI) is formed over the N-type well and the P-type well. A P-type FinFET 90 is formed over the N-type well, and an N-type FinFET 91 is formed over the P-type well. The P-type FinFET 90 includes fins 95 that protrude upwardly out of the STI, and the N-type FinFET 91 includes fins 96 that protrude upwardly out of the STI. The fins 95 include the channel regions of the P-type FinFET 90, and the fins 96 include the channel regions of the N-type FinFET 91. In some embodiments, the fins 95 are comprised of silicon germanium, and the fins 96 are comprised of silicon. A gate dielectric is formed over the fins 95-96 and over the STI, and a gate electrode is formed over the gate dielectric. In some embodiments, the gate dielectric includes a high-k dielectric material, and the gate electrode includes a metal gate electrode, such as aluminum and/or other refractory metals. In some other embodiments, the gate dielectric may include SiON, and the gate electrode may include polysilicon. A gate via is formed on the gate electrode to provide electrical connectivity to the gate.

FinFET devices offer several advantages over traditional Metal-Oxide Semiconductor Field Effect Transistor (MOSFET) devices (also referred to as planar transistor devices). These advantages may include better chip area efficiency, improved carrier mobility, and fabrication processing that is compatible with the fabrication processing of planar devices. Thus, it may be desirable to design an integrated circuit (IC) chip using FinFET devices for a portion of, or the entire IC chip.

Figure 3:
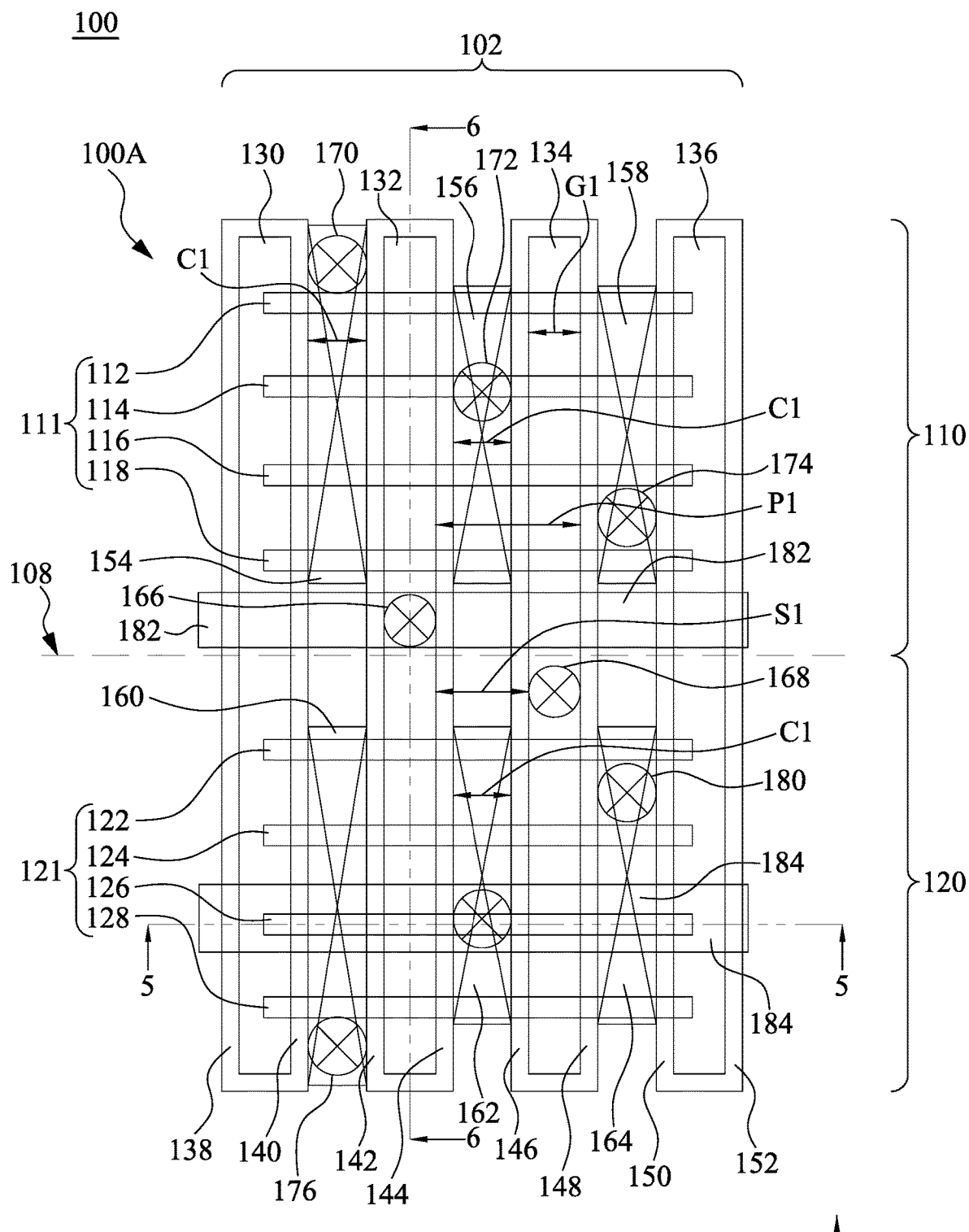
FIG. 3 illustrates a top view of a layout of a first circuit of a semiconductor device.
Figure 4:
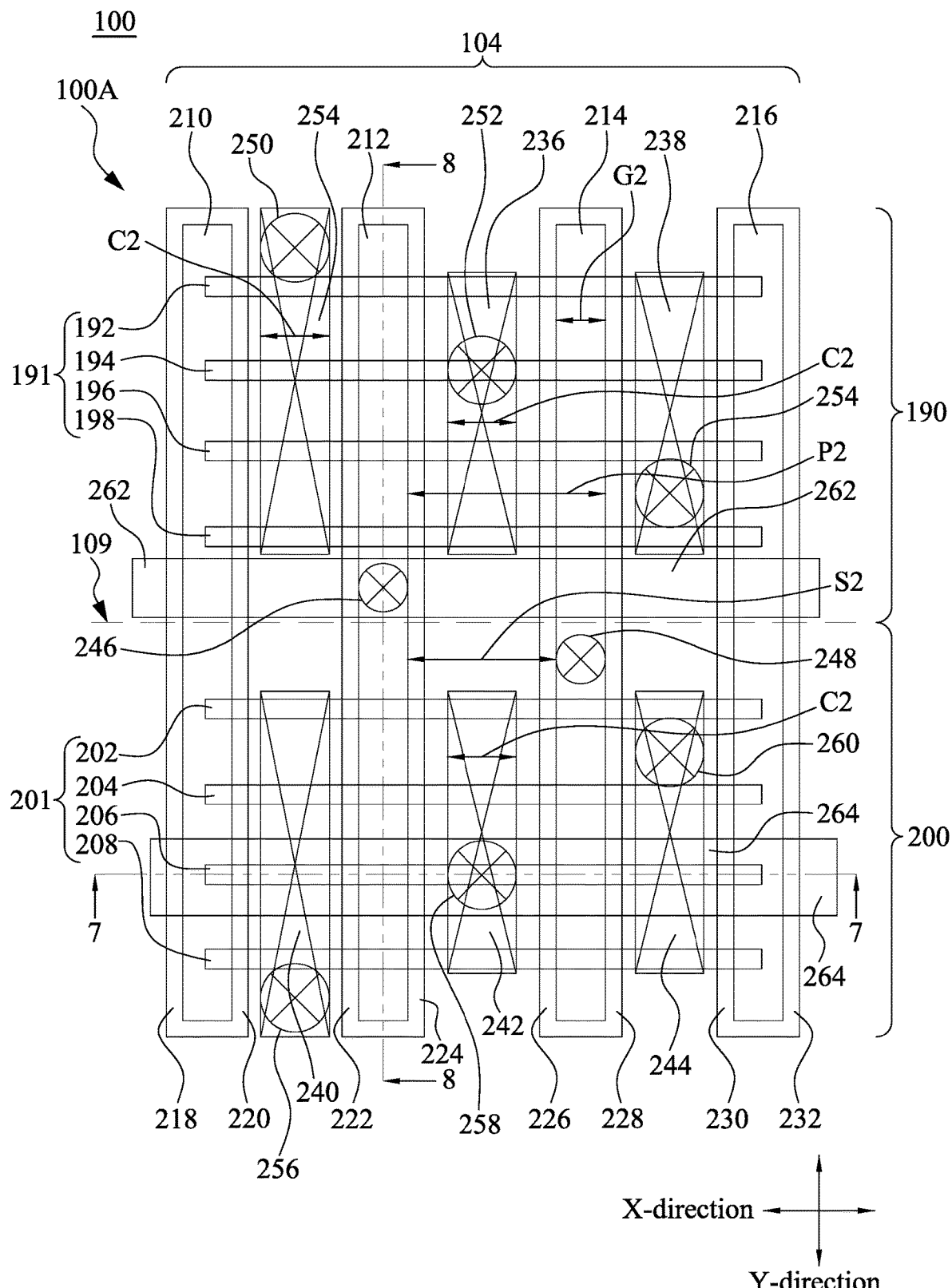
FIG. 4 illustrates a top view of a layout of a second circuit of the semiconductor device.

Reference is made to FIGS. 3 and 4. FIG. 3 illustrates a top view of a layout of a first circuit 102 of a semiconductor device 100. FIG. 4 illustrates a top view of a layout of a second circuit 104 of the semiconductor device 100. Illustrations in FIGS. 3 and 4 can collectively serve as a top view of a layout 100A corresponding to the semiconductor device 100 according to some embodiments of the present disclosure. The semiconductor device 100 includes a first circuit 102 and a second circuit 104. The first circuit 102 and the second circuit 104 are spaced from each other by a region which includes, for example, an isolation structure. In some embodiments, the first circuit 102 may serve as a partial layout of a first device of the semiconductor device 100, and the second circuit 104 may serve as a partial layout of a second device of the semiconductor device 100. In some embodiments, at least one portion of the layout 100A may serve as a partial layout of a SerDes (Serializer/Deserialize) circuit. For example, the second circuit 104 can be used in a SerDes circuit.

The first circuit 102 includes a first active area region 111 with fins 112, 114, 116, 118, a second active area region 121 with fins 122, 124, 126, and 128, a plurality of gate electrodes 130, 132, 134, 136, a plurality of spacers 138, 140, 142, 144, 146, 148, 150, 152, a plurality of contact areas 154, 156, 158, 160, 162, 164, a plurality of gate vias 166, 168, a plurality of source/drain (S/D) vias 170, 172, 174, 176, 178, 180, and a plurality of conductive lines 182, 184.

The first and second active area regions 111 and 121 extend along a X-direction of the layout 100A. The X-direction of the layout 100A can be referred to as the X-direction of FIG. 1. In some embodiments, the first and second active area regions 111 and 121 are also referred to as oxide-definition (OD) regions. Example materials of the first and second active area regions 111 and 121 include, but are not limited to, semiconductor materials doped with various types of p-dopants and/or n-dopants. In some embodiments, the first and second active area regions 111 and 121 include dopants of the same type. In some embodiments, one of the first and second active area regions 111 and 121 includes dopants of a type different from a type of dopants of another one of the first and second active area regions 111 and 121. The first and second active area regions 111 and 121 are isolated from each other by one or more isolation structures as described herein. The first and second active area regions 111 and 121 are within corresponding well regions. For example, the first active area region 111 is within a well region 110 which is a p-well region in one or more embodiments, and the second active area region 121 is within a well region 120 which is an n-well region in one or more embodiments. The described conductivity of the well regions 110 and 120 is an example. Other arrangements are within the scope of various embodiments.

The p-well region 110 and the n-well region 120 are on opposite sides of an imaginary line 108 which divides the semiconductor device into separate regions for different types of devices or transistors. Examples of transistors include, but are not limited to, metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), FinFETs, planar MOS transistors with raised source/drains, or the like. In the example configuration in FIG. 3, the p-well region 110 is a region for forming n-channel metal-oxide semiconductor (NMOS) transistors, and the n-well region 120 is a region for forming p-channel metal-oxide semiconductor (PMOS) transistors. Each of the first and second active area regions 111 and 121 includes one or more fins to form FinFETs as described in FIGS. 1 and 2.

For example, the first active area region 111 comprises the four fins 112, 114, 116, 118 and the second active area region 121 comprises the four fins 122, 124, 126, 128. The fins 112, 114, 116, 118, 122, 124, 126, 128 are isolated from each other by one or more isolation structures as described herein. Other numbers of fins in each of the first and second active area regions 111 and 121 are within the scope of various embodiments. The described FinFET configuration is an example. Other arrangements are within the scope of various embodiments. For example, in one or more embodiments, the first and second active area regions 111 and 121 do not include fins and are configured for forming planar MOSFET transistors.

The fins 112, 114, 116, 118, 122, 124, 126, 128 are extend in an elongated manner in the X-direction. In some embodiments, the fins 112, 114, 116, 118 are parts of the NMOSFET, and the fins 122, 124, 126, 128 are parts of the PMOSFET. The NMOSFET fins 112, 114, 116, 118 are located over the p-well region 110, whereas the PMOSFET fins 122, 124, 126, 128 are located over the n-well region 120. In some embodiments, the NMOSFET fins 112, 114, 116, 118 comprise a non-germanium-containing semiconductor material, for example Si, but the PMOSFET fins 122, 124, 126, 128 comprise a silicon germanium (SiGe) material (for strain effect enhancement). In some embodiment, at least one of the fins 112, 114, 116, 118 of the first active area region 111 and the fins 122, 124, 126 128 of the second active area region 121 has a width measured along the Y-direction as described with respect to the fin width $W_{fin}$ in FIG. 1.

The gate electrodes 130, 132, 134, 136 extend along an Y-direction of the layout 100A. The Y-direction of the layout 100A can be referred to as the Y-direction of FIG. 1. The gate electrodes 130, 132, 134, 136 are across first and second active area regions 111 and 121. Example materials of the gate electrodes 130, 132, 134, 136 include, but are not limited to, polysilicon and metal. Other materials are within the scope of various embodiments. The gate electrodes 130, 132, 134, 136 and the corresponding first and second active area regions 111 and 121 form one or more transistors in the first circuit 102. In the example configuration in FIG. 3, a transistor may be formed by the gate electrode 132 and the first active area region 111, and such transistor may include a gate, a drain and a source. The gate of the transistor is formed by the gate electrode 132. One of the drain or the source (referred to herein as "source/drain" or "S/D") of the transistor is defined by a region of the first active area region 111 on one side (e.g., the right side in FIG. 3) of the gate electrode 132. The other source/drain of the transistor is defined by another region of the first active area region 111 on the opposite side (e.g., the left side in FIG. 3) of the gate electrode 132. For another example, a further transistor may be formed by the gate electrode 132 and the second active area region 121. In at least one embodiment, such further transistors are formed by the gate electrode 130 and the corresponding first and second active area regions 111 and 121. One or more of the gate electrodes 130, 132, 134, 136 are coupled to other circuitry of the semiconductor device 100 by corresponding gate vias. For example, the gate vias 166, 168 may be respectively formed on the gate electrodes 132, 134 and configured to electrically couple to the gate electrodes 132, 134 to other circuitry. In some embodiments, the gate vias 166, 168 overlap the corresponding gate electrodes 132, 134 and respectively have vertical projections projected on the corresponding gate electrodes 132, 134. The gate vias 166, 168 may be in a circle shape.

In some embodiment, at least one of the gate electrodes 130, 132, 134, 136 has a first width measured along the X-direction as described with respect to the length $L_G$ of the gate 60 in FIG. 1. The first width of at least one of the gate electrodes 130, 132, 134, 136 may define a first gate length. For example, the gate electrode 134 crossing over the fin 112 has a first gate length G1 along a longitudinal direction of at least one of the fins 112-118, 122-128 (i.e., the X-direction of the layout 100A). In some embodiments, a pair of the adjacent gate electrodes 130, 132, 134, 136 are spaced from each other by a first spacing measured along the X-direction. For example, the adjacent gate electrodes 132, 134 are spaced from each other by the first spacing S1. The first spacing S1 can be referred to as a distance that is measured along the X-direction and between boundaries of the adjacent gate electrodes 132, 134. For example, one side (e.g., the right side in FIG. 3) of the boundary of the gate electrode 132 and the opposite side (e.g., the left side in FIG. 3) of the boundary of the gate electrode 134 are spaced from each other by the first spacing S1. In some embodiments, the gate electrodes 130, 132, 134, 136 can be arranged along the X-direction by a first pitch P1, which can be defined by a sum of the first width and the first spacing. For example, the first pitch P1 is equal to a sum of the first width G1 and the first spacing S1, and thus the first pitch P1 is equal to a distance measured along the X-direction from one side (e.g., the right side in FIG. 3) of the boundary of the gate electrode 132 and the same side (e.g., the right side in FIG. 3) of the boundary of the gate electrode 134.

The spacers 138, 140, 142, 144, 146, 148, 150, 152 are arranged along sides of the corresponding gate electrodes 130, 132, 134, 136. For example, the spacers 142 and 144 are arranged along longitudinal sides of the gate electrode 132 in the X-direction, and the spacers 146 and 148 are arranged along longitudinal sides of the gate electrode 134 in the X-direction. The spacers 138, 140, 142, 144, 146, 148, 150, 152 include one or more dielectric materials for electrically isolating the corresponding gate electrodes from unintended electrical contact. Example dielectric materials of the spacers include, but are not limited to, silicon nitride, oxynitride and silicon carbide. In at least one embodiment, one or more of the spacers 138, 140, 142, 144, 146, 148, 150, 152 have a tapered profile as described herein.

The contact areas 154, 156, 158, 160, 162, 164 overlap the corresponding first and second active area regions 111 and 121. For example, the contact areas 154, 156, 158 overlap the first active area region 111, and the contact areas 160, 162, 164 overlap the second active area region 121. The contact areas 154, 156, 158, 160, 162, 164 are configured to electrically couple the underlying source/drains of the corresponding transistors with each other or with other circuitry of the semiconductor device 100. In some embodiments, a plurality of contact plugs are disposed within the corresponding contact areas 154, 156, 158, 160, 162, 164. In the example configuration in FIG. 3, boundaries of one or more of the contact areas 154, 156, 158, 160, 162, 164 are spaced from boundaries of the spacers 138, 140, 142, 144, 146, 148, 150, 152. For example, a left edge of the contact area 156 is spaced in the X-direction from an adjacent right edge of the spacer 144, and a right edge of the contact area 145 is spaced in the X-direction from an adjacent left edge of the spacer 146. Other arrangements are within the scope of various embodiments. For example, in one or more embodiments, one or more of the contact areas are self-aligned contacts (SAC) having boundaries defined at least partially by boundaries of the spacers 138, 140, 142, 144, 146, 148, 150, 152. In some embodiments, the contact areas 154, 156, 158, 160, 162, 164 are rectangular. For example, at least one of the contact areas 154, 156, 158, 160, 162, 164 has a slot shape having a pair of longer sides and a pair of shorter sides, in which a ratio of a length of the longer sides to a length of the shorter sides is in a range from 2 to 30. Such ratio may be advantageous to avoid yield loss. For example, a planarization process, such as a chemical mechanical polishing (CMP) process can be performed smoothly. In some embodiment, at least one of the contact areas 154, 156, 158, 160, 162, 164 has a first contact width measured along the X-direction. For example, each of the contact areas 154, 156, 162 has the first contact width C1 measured along the X-direction.

The S/D vias 170, 172, 174, 176, 178, 180 respectively overlap with the contact areas 154, 156, 158, 160, 162, 164 and respectively have vertical projections projected on the contact areas 154, 156, 158, 160, 162, 164. The S/D vias 170, 172, 174, 176, 178, 180 are in a circle shape. In the layout 100A, at least one of the S/D vias 170, 172, 174, 176, 178, 180 is circular and has a first circular area. The S/D vias 170, 172, 174, 176, 178, 180 can be configured to electrically couple to the contact areas 154, 156, 158, 160, 162, 164 to other circuitry.

The conductive lines 182 and 184 extend along the X-direction of the layout 100A. In some embodiments, the conductive lines 182 and 184 are in a first interconnection layer of the layout 100A, such as a first metal layer. The conductive lines 182 and 184 overlap and are electrically connected to corresponding elements. For example, the conductive line 182 overlaps with the gate electrode 132, and the conductive line 184 overlaps with the fin 126. In some embodiments, the conductive line 182 is electrically connected to the gate electrode 132 through the gate via 168. In some embodiments, and the conductive line 184 overlaps with the contact area 162 and is electrically connected to the contact area 162 through the S/D via 178.

The second circuit 104 includes a plurality of a third active area region 191 with fins 192, 194, 196, 198, a fourth active area region 201 with fins 202, 204, 206, 208, a plurality of gate electrodes 210, 212, 214, 216, a plurality of spacers 218, 220, 222, 224, 226, 228, 230, 232, a plurality of contact areas 234, 236, 238, 240, 242, 244, a plurality of gate vias 246, 248, a plurality of S/D vias 250, 252, 254, 256, 258, 260, and a plurality of conductive lines 262, 264.

The third and fourth active area regions 191 and 201 extend along the X-direction of the layout 100A. In some embodiments, the third and fourth active area regions 191 and 201 are also referred to as OD regions. Example materials of the third and fourth active area regions 191 and 201 include, but are not limited to, semiconductor materials doped with various types of p-dopants and/or n-dopants. In some embodiments, the third and fourth active area regions 191 and 201 include dopants of the same type. In some embodiments, one of the third and fourth active area regions 191 and 201 includes dopants of a type different from a type of dopants of another one of the third and fourth active area regions 191 and 201. The third and fourth active area regions 191 and 201 are isolated from each other by one or more isolation structures as described herein. The third and fourth active area regions 191 and 201 are within corresponding well regions. For example, the third active area region 191 is within a well region 190 which is a p-well region in one or more embodiments, and the fourth active area region 201 is within a well region 200 which is an n-well region in one or more embodiments. The described conductivity of the well regions 190 and 200 is an example. Other arrangements are within the scope of various embodiments.

The p-well region 190 and the n-well region 200 are on opposite sides of an imaginary line 109 which divides the semiconductor device into separate regions for different types of devices or transistors. Examples of transistors include, but are not limited to, MOSFET, CMOS transistors, BJT, high voltage transistors, high frequency transistors, PFETs and/or NFETs, FinFETs, planar MOS transistors with raised source/drains, or the like. In the example configuration in FIG. 4, the p-well region 190 is a region for forming NMOS transistors, and the n-well region 200 is a region for forming PMOS transistors. Each of the third and fourth active area regions 191 and 201 includes one or more fins to form FinFETs as described in FIGS. 1 and 2. For example, the third active area region 191 comprises the four fins 192, 194, 196, 198 and the fourth active area region 201 comprises the four fins 202, 204, 206, 208. The fins 192, 194, 196, 198, 202, 204, 206, 208 are isolated from each other by one or more isolation structures as described herein. Other numbers of fins in each of the third and fourth active area regions 191 and 201 are within the scope of various embodiments. The described FinFET configuration is an example. Other arrangements are within the scope of various embodiments. For example, in one or more embodiments, the third and fourth active area regions 191 and 201 do not include fins and are configured for forming planar MOSFET transistors.

The fins 192, 194, 196, 198, 202, 204, 206, 208 are extend in an elongated manner in the X-direction. In some embodiments, the fins 192, 194, 196, 198 are parts of the NMOSFET, and the fins 202, 204, 206, 208 are parts of the PMOSFET. The NMOSFET fins 192, 194, 196, 198 are located over the p-well region 190, whereas the PMOSFET fins 202, 204, 206, 208 are located over the n-well region 200. In some embodiments, the NMOSFET fins 192, 194, 196, 198 comprise a non-germanium-containing semiconductor material, for example Si, but the PMOSFET fins 202, 204, 206, 208 comprise a silicon germanium (SiGe) material (for strain effect enhancement). In some embodiment, at least one of the fins 192, 194, 196, 198 of the third active area region 191 and the fins 202, 204, 206, 208 of the fourth active area region 201 has a width measured along the Y-direction as described with respect to the fin width $W_{fin}$ in FIG. 1.

The gate electrodes 210, 212, 214, 216 extend along the Y-direction of the layout 100A. The gate electrodes 210, 212, 214, 216 are across the third and fourth active area regions 191 and 201. Example materials of the gate electrodes 210, 212, 214, 216 include, but are not limited to, polysilicon and metal. Other materials are within the scope of various embodiments. The gate electrodes 210, 212, 214, 216 and the corresponding third and fourth active area regions 191 and 201 form one or more transistors in the second circuit 104. In the example configuration in FIG. 4, a transistor may be formed by the gate electrode 212 and the third active area region 191, and such transistor may include a gate, a drain and a source. The gate of the transistor is formed by the gate electrode 212. One of the drain or the source (referred to herein as "source/drain" or "S/D") of the transistor is defined by a region of the third active area region 191 on one side (e.g., the right side in FIG. 4) of the gate electrode 212. The other source/drain of the transistor is defined by another region of the third active area region 191 on the opposite side (e.g., the left side in FIG. 4) of the gate electrode 212. For another example, a further transistor may be formed by the gate electrode 212 and the fourth active area region 201. In at least one embodiment, such further transistors are formed by the gate electrode 210 and the corresponding third and fourth active area regions 191 and 201. One or more of the gate electrodes 210, 212, 214, 216 are coupled to other circuitry of the semiconductor device 100 by corresponding gate vias. For example, the gate vias 246, 248 may be respectively formed on the gate electrodes 212, 214 and configured to electrically couple to the gate electrodes 212, 214 to other circuitry. In some embodiments, the gate vias 246, 248 overlap the corresponding gate electrodes 212, 214 and respectively have vertical projections projected on the corresponding gate electrodes 212, 214. The gate vias 246, 248 may be in a circle shape.

In some embodiment, at least one of the gate electrodes 210, 212, 214, 216 has a second width measured along the X-direction as described with respect to the length $L_G$ of the gate 60 in FIG. 1. The second width of at least one of the gate electrodes 210, 212, 214, 216 may define a second gate length. For example, the gate electrode 214 crossing over the and fin 192 has a second gate length G2 along a longitudinal direction of at least one of the fins 192-198, 202-208 (i.e., the X-direction of the layout 100A). In some embodiments, a pair of the adjacent gate electrodes 210, 212, 214, 216 are spaced from each other by a second spacing measured along the X-direction. For example, the adjacent gate electrodes 212, 214 are spaced from each other by the second spacing S2. The second spacing S2 can be referred to as a distance that is measured along the X-direction and between boundaries of the adjacent gate electrodes 212, 214. For example, one side (e.g., the right side in FIG. 4) of the boundary of the gate electrode 212 and the opposite side (e.g., the left side in FIG. 4) of the boundary of the gate electrode 214 are spaced from each other by the second spacing S2. In some embodiments, the gate electrodes 210, 212, 214, 216 can be arranged along the X-direction by a second pitch P2, which can be defined by a sum of the second width and the second spacing. For example, the second pitch P2 is equal to a sum of the second width G2 and the second spacing S2, and thus the second pitch P2 is equal to a distance measured along the X-direction from one side (e.g., the right side in FIG. 4) of the boundary of the gate electrode 212 and the same side (e.g., the right side in FIG. 4) of the boundary of the gate electrode 214.

The spacers 218, 220, 222, 224, 226, 228, 230, 232 are arranged along sides of the corresponding gate electrodes 210, 212, 214, 216. For example, the spacers 222 and 224 are arranged along longitudinal sides of the gate electrode 212 in the X-direction, and the spacers 226 and 228 are arranged along longitudinal sides of the gate electrode 214 in the X-direction. The spacers 218, 220, 222, 224, 226, 228, 230, 232 include one or more dielectric materials for electrically isolating the corresponding gate electrodes from unintended electrical contact. Example dielectric materials of the spacers include, but are not limited to, silicon nitride, oxynitride and silicon carbide. In at least one embodiment, one or more of the spacers 218, 220, 222, 224, 226, 228, 230, 232 have a tapered profile as described herein.

The contact areas 234, 236, 238, 240, 242, 244 overlap the corresponding third and fourth active area regions 191 and 201. For example, the contact areas 234, 236, 238 overlap the third active area region 191, and the contact areas 240, 242, 244 overlap the fourth active area region 201. The contact areas 234, 236, 238, 240, 242, 244 are configured to electrically couple the underlying source/drains of the corresponding transistors with each other or with other circuitry of the semiconductor device 100. In some embodiments, a plurality of contact plugs are disposed within the corresponding contact areas 234, 236, 238, 240, 242, 244. In the example configuration in FIG. 4, boundaries of one or more of the contact areas 234, 236, 238, 240, 242, 244 are spaced from boundaries of the spacers 218, 220, 222, 224, 226, 228, 230, 232. For example, a left edge of the contact area 236 is spaced in the X-direction from an adjacent right edge of the spacer 224, and a right edge of the contact area 236 is spaced in the X-direction from an adjacent left edge of the spacer 226. Other arrangements are within the scope of various embodiments. For example, in one or more embodiments, one or more of the contact areas are SAC having boundaries defined at least partially by boundaries of the spacers 218, 220, 222, 224, 226, 228, 230, 232. In some embodiments, the contact areas 234, 236, 238, 240, 242, 244 are rectangular. For example, at least one of the contact areas 234, 236, 238, 240, 242, 244 has a slot shape having a pair of longer sides and a pair of shorter sides, in which a ratio of a length of the longer sides to a length of the shorter sides is in a range from 2 to 30. Such ratio may be advantageous to avoid yield loss. For example, a planarization process, such as a CMP process can be performed smoothly. In some embodiment, at least one of the contact areas 234, 236, 238, 240, 242, 244 has a second contact width measured along the X-direction. For example, each of the contact areas 234, 236, 258 has the second contact width C2 measured along the X-direction.

The S/D vias 250, 252, 254, 256, 258, 260 respectively overlap with the contact areas 234, 236, 238, 240, 242, 244 and respectively have vertical projections projected on the contact areas 234, 236, 238, 240, 242, 244. The S/D vias 250, 252, 254, 256, 258, 260 are in a circle shape. In the layout 100A, at least one of the S/D vias 250, 252, 254, 256, 258, 260 is circular and has a first circular area. The S/D vias 250, 252, 254, 256, 258, 260 can be configured to electrically couple to the contact areas 234, 236, 238, 240, 242, 244 to other circuitry.

The conductive lines 262 and 264 extend along the X-direction of the layout 100A. In some embodiments, the conductive lines 262 and 264 are in the first interconnection layer of the layout 100A, such as the first metal layer. The conductive lines 262 and 264 overlap and are electrically connected to corresponding elements. For example, the conductive line 262 overlaps with the gate electrode 212, and the conductive line 264 overlaps with the fin 206. In some embodiments, the conductive line 262 is electrically connected to the gate electrode 212 through the gate via 248. In some embodiments, and the conductive line 264 overlaps with the contact area 242 and is electrically connected to the contact area 242 through the S/D via 258.

Figure 5:
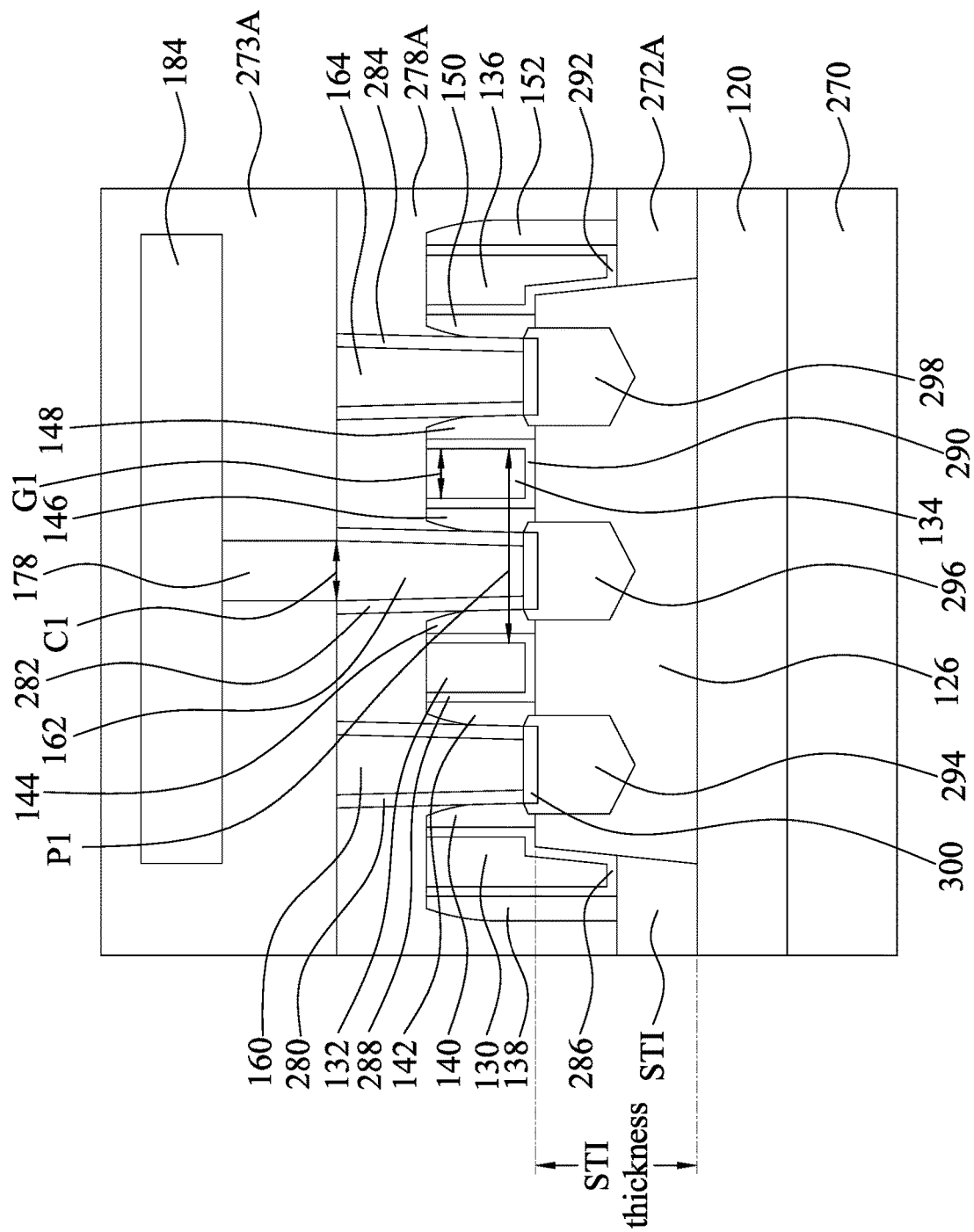
FIGS. 5 and 6 are cross-section views of the semiconductor device having the layout.
Figure 6:
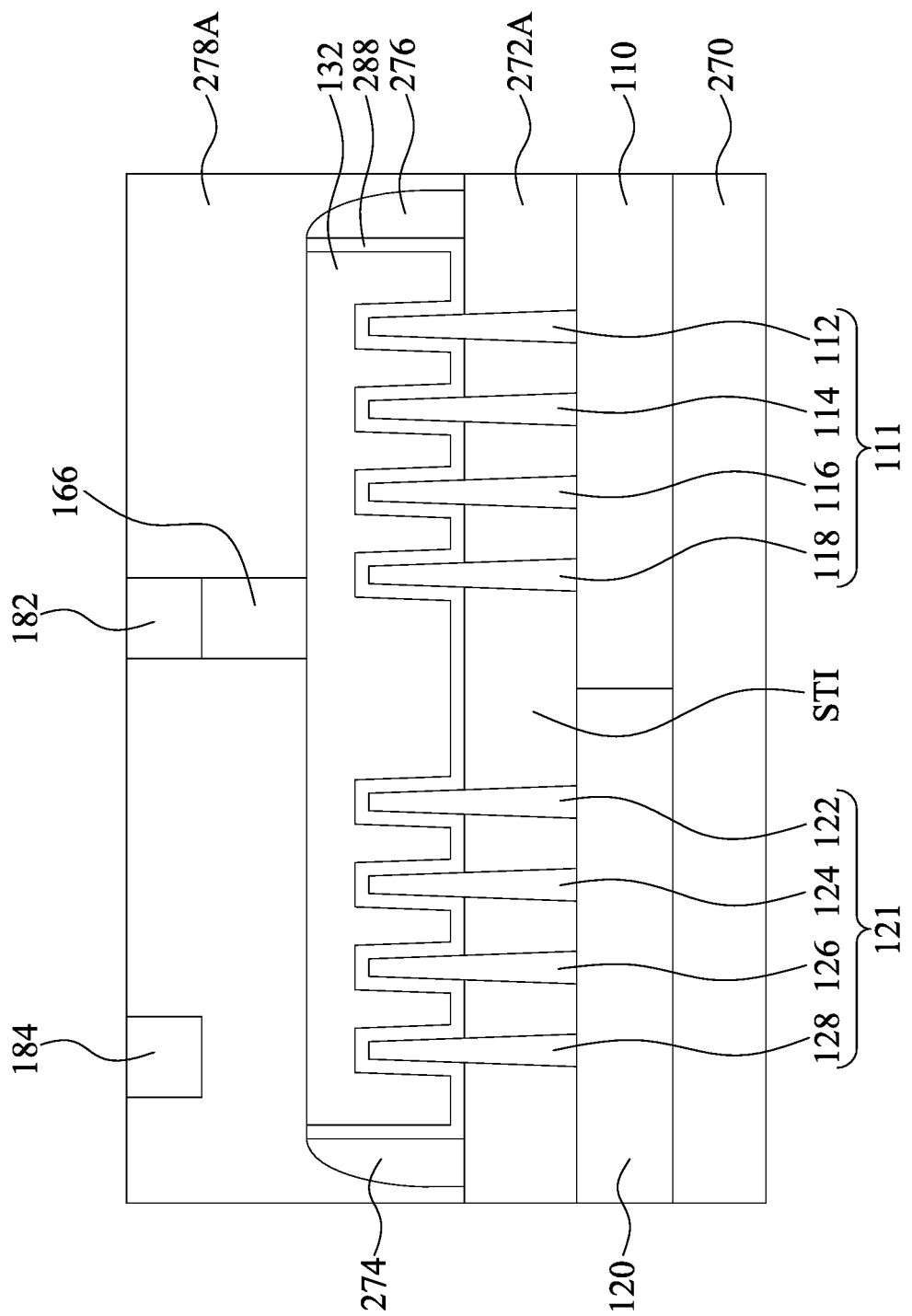

Reference is made to FIGS. 5 and 6. FIGS. 5 and 6 are cross-section views of the semiconductor device 100 having the layout 100A. The cross-section view in FIG. 5 is taken along line 5-5 in FIG. 3. The cross-section view in FIG. 6 is taken along line 6-6 in FIG. 3. The configuration of the semiconductor device 100 is described herein with respect to both FIG. 5 and FIG. 6. The structures shown in FIGS. 5 and 6 can be formed by modelling in a layout as depicted in FIG. 3, and then physical elements or layers are formed by using the gate electrode and the gate contact as patterns.

As illustrated in FIGS. 5 and 6, the semiconductor device 100 comprises a substrate 270 over which various elements of the semiconductor device 100 are formed. The elements of the semiconductor device 100 include active elements and/or passive elements. In at least one embodiment, active elements are arranged in a circuit region of the semiconductor device to provide one or more functions and/or operations intended to be performed by the semiconductor device. In at least one embodiment, the semiconductor device further comprises a non-circuit region, e.g., a sealing region, that extends around and protects the circuit region. Examples of active elements include, but are not limited to, transistors and diodes. Examples of transistors are described herein with respect to FIG. 3. Examples of passive elements include, but are not limited to, capacitors, inductors, fuses, and resistors. A plurality of metal layers and via layers are alternatingly formed over the substrate 270 to electrically couple the elements of the semiconductor device 100 with each other and/or with external devices. The substrate 270 comprises, in at least one embodiment, a silicon substrate. The substrate 270 comprises, in at least one embodiment, silicon germanium (SiGe), Gallium arsenic, P-type doped Si, N-type doped Si, or suitable semiconductor materials. For example, semiconductor materials including group III, group IV, and group V elements are within the scope of various embodiments. In some embodiments, the substrate 270 further includes one or more other features, such as various doped regions, a buried layer, and/or an epitaxy (epi) layer. In some embodiments, the substrate 270 comprises a semiconductor on insulator, such as silicon on insulator (SOI). In some embodiments, the substrate 270 includes a doped epi layer, a gradient semiconductor layer, and/or a semiconductor layer overlying another semiconductor layer of a different type such as a silicon layer on a silicon germanium layer.

The semiconductor device 100 further comprises one or more well regions over the substrate 270. In the example configuration in FIG. 5, the n-well region 120 is over the substrate 270, as described with respect to FIG. 3. In the example configuration in FIG. 6, the n-well region 120 and p-well region 110 are over the substrate 270, as described with respect to FIG. 3.

The semiconductor device 100 further comprises one or more isolation structures over and around the well regions 110, 120. In the example configuration in FIGS. 5 and 6, an isolation structure 272A is over the well regions 110, 120. The isolation structure 272A electrically isolates various elements of the semiconductor device 100 from each other. For example, as illustrated in FIG. 6, the isolation structure 272A electrically isolates the fins 112-118 in the first active area region 111 from the fins 122-128 in the second active area region 121. In the cross-section in FIG. 5, the isolation structure 272A has a thickness less than the fin 126; however, outside the cross-section shown in FIG. 5, the isolation structure 272A includes regions where the thickness of the isolation structure 272A is higher, as indicated by the arrow designated with "STI thickness" in FIG. 5. In at least one embodiment, the isolation structure 272A comprises one or more shallow trench isolation (STI) regions. Example materials of the STI regions include, but are not limited to, silicon oxide, silicon nitride, silicon oxynitride, fluoride-doped silicate, and/or any other low k dielectric materials. In some embodiments, the STI thickness is from 50 nm to 200 nm.

The semiconductor device 100 further comprises active area regions, gate electrodes, and corresponding spacers over the isolation structure. In the example configuration in FIGS. 5 and 6, the first and second active area regions 111, 121 (best seen in FIG. 6), gate electrodes 130, 132, 134, 136, and corresponding spacers 138, 140, 142, 144, 146, 148, 150, 152 (best seen in FIG. 5), 274, 276 (best seen in FIG. 6) over the isolation structure 272A. In the example configuration in FIGS. 4 and 5, the gate electrodes 130, 132, 134, 136, and the corresponding spacers 138, 140, 142, 144, 146, 148, 150, 152, 274, 276 are over the isolation structure 272A. Other arrangements are within the scope of various embodiments. For example, in one or more embodiments, the gate electrodes 130, 132, 134, 136 and/or one or more of the corresponding spacers 138, 140, 142, 144, 146, 148, 150, 152, 274, 276 are partially embedded in the isolation structure 272A. In addition, in the example configuration in FIG. 6, the spacers 274, 276 may adhere to opposite sidewalls of the gate electrode 132.

The semiconductor device 100 further comprises an inter-layer dielectric (ILD) layer over the isolation structure. In the example configuration in FIGS. 5 and 6, the semiconductor device 100 comprises an inter-layer dielectric (ILD) layer 278A over the isolation structure 272A. Example materials of the ILD layer 278A include, but are not limited to, $SiN_x$, $SiO_x$, SiON, SiC, SiBN, SiCBN, or combinations thereof. The ILD layer 278A embeds therein the gate electrodes 130, 132, 134, 136, and/or the corresponding spacers 138, 140, 142, 144, 146, 148, 150, 152, 274, 276. The ILD layer 278A further embeds therein the fins 112-118 of the first active area region 111 and the fins 122-128 of the second active area region 121 and contact plugs in the corresponding contact areas 160, 162, 164. For the sake of simplicity, the contact plugs are designated by the same reference numerals of the corresponding contact areas.

In the example configuration in FIG. 5, three contact plugs 160, 162, 164 are above the fin 126. Example materials of the contact plugs 160, 162, 164 include, but are not limited to, Ti, TiN, TaN, Co, Ru, Pt, W, Al, Cu, or combinations thereof. In some embodiments, at least one of the contact plugs 160, 162, 164 includes multiple metal material. In some embodiments, the contact plugs 160, 162, 164 are surrounded corresponding barrier layers 280, 282, 284. Example materials of the barrier layers 280, 282, 284 include, Ti, TiN, or combinations thereof.

At least one of the contact plugs 160, 162, 164 is electrically connected to the first interconnection layer of the layout 100A as depicted in FIG. 3. For example, the S/D via 178 between the contact plug 162 and the conductive line 184 is electrically coupled the contact plug 162 to the conductive line 184. In addition, in some embodiments, the semiconductor device 100 may further comprise an inter-metal dielectric (IMD) layer 273A above the ILD layer 278A, and the IMD layer 273A may embed therein the S/D via 178 and the conductive line 184. In the example configuration in FIG. 6, the gate via 166 is above the gate electrode 132 and between the gate electrode 132 and the conductive line 182 which is in the first interconnection layer of the layout 100A as depicted in FIG. 3. Example materials of the gate via 166 include, but are not limited to, Ti, TiN, TaN, Co, Ru, Pt, W, Al, Cu, or combinations thereof.

The semiconductor device 100 further comprises gate electrodes and gate dielectric layers. In the example configuration in FIGS. 5 and 6, the gate electrodes 130, 132, 134, 136 wrap over the fins 112-118, 122-128 of the first and second active area regions 111, 121 in regions where the gate electrodes 130, 132, 134, 136 cross over the fins 112-118, 122-128. To electrically isolate the gate electrodes 130, 132, 134, 136 from the fins 112-118, 122-128, first gate dielectric layers 286, 288, 290, 292 are arranged under and around the corresponding gate electrodes 130, 132, 134, 136. The spacers 138, 140, 142, 144, 146, 148, 150, 152 are over opposite sides of the corresponding first gate dielectric layers 286, 288, 290, 292. Example materials of the first gate dielectric layers 286, 288, 290, 292 include, but are not limited to, a high-k dielectric layer, an interfacial layer, and/or combinations thereof. Example materials for the high-k dielectric layer include, but are not limited to, silicon nitride, silicon oxynitride, hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), metal oxides, metal nitrides, metal silicates, transition metal-oxides, transition metal-nitrides, transition metal-silicates, oxynitrides of metals, metal aluminates, zirconium silicate, zirconium aluminate, zirconium oxide, titanium oxide, aluminum oxide, hafnium dioxide-alumina ($HfO_2$—$Al_2O_3$) alloy, suitable high-k dielectric materials, and/or combinations thereof. In at least one embodiment, a first gate dielectric layer includes multi-layer structure of, for example, $SiO_2$ with a high-k dielectric, or SiON with a high-k dielectric.

In some embodiments, the gate electrodes 130, 132, 134, 136 include one or more conductive layers and/or materials. In the example configuration in FIG. 6, the gate electrode 132 is wrapped over the fins 112-118, 122-128, and includes a first conductive gate material over the p-well region 110 and a second conductive gate material over the n-well region 120. In at least one embodiment, the first and second conductive gate materials include the same conductive material. In at least one embodiment, the first and second conductive gate materials include different conductive materials. In at least one embodiment, the conductive material or materials of at least one of the first and second conductive gate materials is/are selected in accordance with the type of device or transistor. For example, each of the first and second conductive gate materials includes a conductive work function layer and a contact layer over the conductive work function layer.

In at least one embodiment, the work function layer is configured to have a work function in a range from 4 eV to 5 eV. In some embodiments, the first conductive gate material includes an n-type work function metal (n-metal) for forming an NMOS over the p-well region 110. Example n-metals include, but are not limited to, Ta, TiAl, and TiAlN. In some embodiments, the second conductive gate material includes a p-type work function metal (p-metal) for forming a PMOS over the n-well region 120. Example p-metals include, but are not limited to, TiN, TaN, a carbon-doped metal nitride such as TaCN. Other work function materials are within the scope of various embodiments. For example, in one or more embodiments, the work function layer comprises doped conducting oxide materials, TaAl, TiSi, NiSi, PtSi, suitable Ti containing work function materials, suitable Ta containing work function materials, suitable Al containing work function materials, and suitable W containing work function materials.

In at least one embodiment, the contact layer over the conductive work function layer is configured to have a low contact resistance. Example materials of the contact layer include, but are not limited to, polysilicon with silicide, refractory materials such as TiN, TaN, TiW, and TiAl, suitable Ti containing work function materials, suitable Ta containing work function materials, suitable Al containing work function materials, suitable W containing work function materials, suitable Cu containing work function materials, and suitable N containing work function materials.

The first conductive gate material and the second conductive gate material are isolated from the fins 112-118, 122-128 by the corresponding first gate dielectric layer 288. In some embodiments, the first gate dielectric layer 288 has a first portion over the n-well region 120 and a second portion over the p-well region 110. In at least one embodiment, the first and second portions of the first gate dielectric layer 288 include the same dielectric material. In at least one embodiment, the first and second portions of the first gate dielectric layer 288 include different dielectric materials. In the example configuration in FIG. 6, the gate electrode 132 extends continuously from the n-well region 120 into the p-well region 110, and the first conductive gate material is in contact with the second conductive gate material. Other arrangements are within the scope of various embodiments. For example, in at least one embodiment, at least one of the first and second portions of the first gate dielectric layer 288 is interposed between and electrically isolates the first conductive gate material and the second conductive gate material. In at least one embodiment, at least one of the first and second portions of the first gate dielectric layer 288 includes one or more of $HfO_2$, $Ta_2O_5$ and $Al_2O_3$.

In at least one embodiment, the work function layer, the contact layer and the gate dielectric layer configure a gate stack structure. Examples of gate stack structures include, but are not limited to, a metals/high-K dielectric structure, an Al/refractory metals/high-K dielectric structure, a W/refractory metals/high-K dielectric structure, a Cu/refractory metals/high-K dielectric structure, and a silicide/high-K dielectric structure. In at least one embodiment, the gate stack structure includes a $Si_3N_4$/metals/high-K dielectric structure in which the metals are selected from the group consisting of Al/refractory metals, W/refractory metals, Cu/refractory metals, silicide, and combinations thereof.

In the semiconductor device 100, the contact plugs are arranged in the spaces between adjacent spacers. In the example configuration in FIG. 5, the contact plug 162 is arranged in the space between adjacent spacers 144, 146. At least one side face of the contact plug 162 is spaced from an adjacent side face of the spacer 144 or 146, by a portion of the ILD layer 278A. The contact plug 160 is arranged in the space between adjacent spacers 140, 142. At least one side face of the contact plug 160 is spaced from an adjacent side face of the spacer 140 or 142, by a portion of the ILD layer 278A. The contact plug 164 is arranged in the space between adjacent spacers 148, 150. At least one side face of the contact plug 164 is spaced from an adjacent side face of the spacer 148 or 150, by a portion of the ILD layer 278A. In some embodiments, the top surfaces of the contact plugs 160, 162, 164 are flush with each other due to, e.g., a planarization process during manufacture. Other arrangements are within the scope of various embodiments.

In the semiconductor device 100, the contact plugs are in contact with corresponding source/drains. In the example configuration in FIG. 5, the fin 126 includes source/drains 294, 296, 298 which are in contact with the corresponding contact plugs 160, 162, 164. The source/drains 294, 296, 298 are arranged between adjacent gate electrodes 130, 132, 134, 136. In one or more embodiments, portions of the fin 126 between the adjacent spacers are recessed to form S/D cavities having bottom surfaces lower than the top surface of the fin 126. After the formation of the S/D cavities, the source/drains 294, 296, 298 are produced by epi-growing a strained material in the S/D cavities. In at least one embodiment, the lattice constant of the strained material is different from the lattice constant of the substrate 270. Thus, channel regions of the semiconductor device are strained or stressed to enhance carrier mobility of the device. For example, for a PMOS device, the strained material is configured to apply a compressive stress to enhance hole mobility in the at least one source or drain region of the PMOS device. For an NMOS device, the strained material is configured to apply a tensile stress to enhance electron mobility in the at least one source or drain region of the PMOS device. Examples of the strained material include, but are not limited to, SiGe, SiGeC, SiC, GeSn, SiGeSn, SiP, SiCP and other suitable materials. In at least one embodiment, the strained material for a PMOS device comprises SiGe, SiGeC, Ge, Si, or a combination thereof. In at least one embodiment, the strained material for an NMOS device comprises SiC, SiP, SiCP, Si, or a combination thereof.

In some embodiments, at least one silicide region 300 may be formed on the source/drains 294, 296, 298. In some embodiments, at least one metal layer is formed on the corresponding source/drains 294, 296, 298, and then it may cause a reaction between the underlying silicon and the metal material of the metal layer to form the silicide regions 300. In some embodiments, the silicide regions 300 include a material selected from titanium silicide, cobalt silicide, nickel silicide, platinum silicide, erbium silicide, or palladium silicide. In some embodiments, the source/drains 294, 296, 298 and the corresponding silicide regions 300 may collectively have a rising shape that protrudes above the fin 126. Accordingly, the silicide regions 300 may be in a positon higher than a top surface of the fin 126. For example, the top surface of the fin 126 is in contact with the first gate dielectric layers 288, 290, and an interface between the silicide regions 300 and the corresponding contact plugs 160, 162, 164 is above the top surface of the fin 126.

In the example configuration in FIG. 5, the gate electrodes 130, 132, 134, 136 may define the first gate length. For example, the gate electrode 134 crossing over the fin 126 has the first gate length G1 along the longitudinal direction of the fin 126. In some embodiments, the gate electrodes 130, 132, 134, 136 can be arranged along the X-direction by the first pitch P1 which can be defined by a sum of the first width and the first spacing, as depicted in FIG. 3. For example, the gate electrodes 132 and 134 are arranged along the X-direction by the first pitch P1. In some embodiments, each of the contact plugs 160, 162, 164 respectively corresponding to the contact areas 160, 162, 164 shown in FIG. 3 has the first contact width C1 measured along the X-direction. The first contact width C1 may be referred to as a width of a top surface of at least one of the contact plugs 160, 162, 164. In some embodiments, a length of an interface between the contact plug 162 and the S/D via 178 is substantially the same as the first contact width C1.

Figure 7:
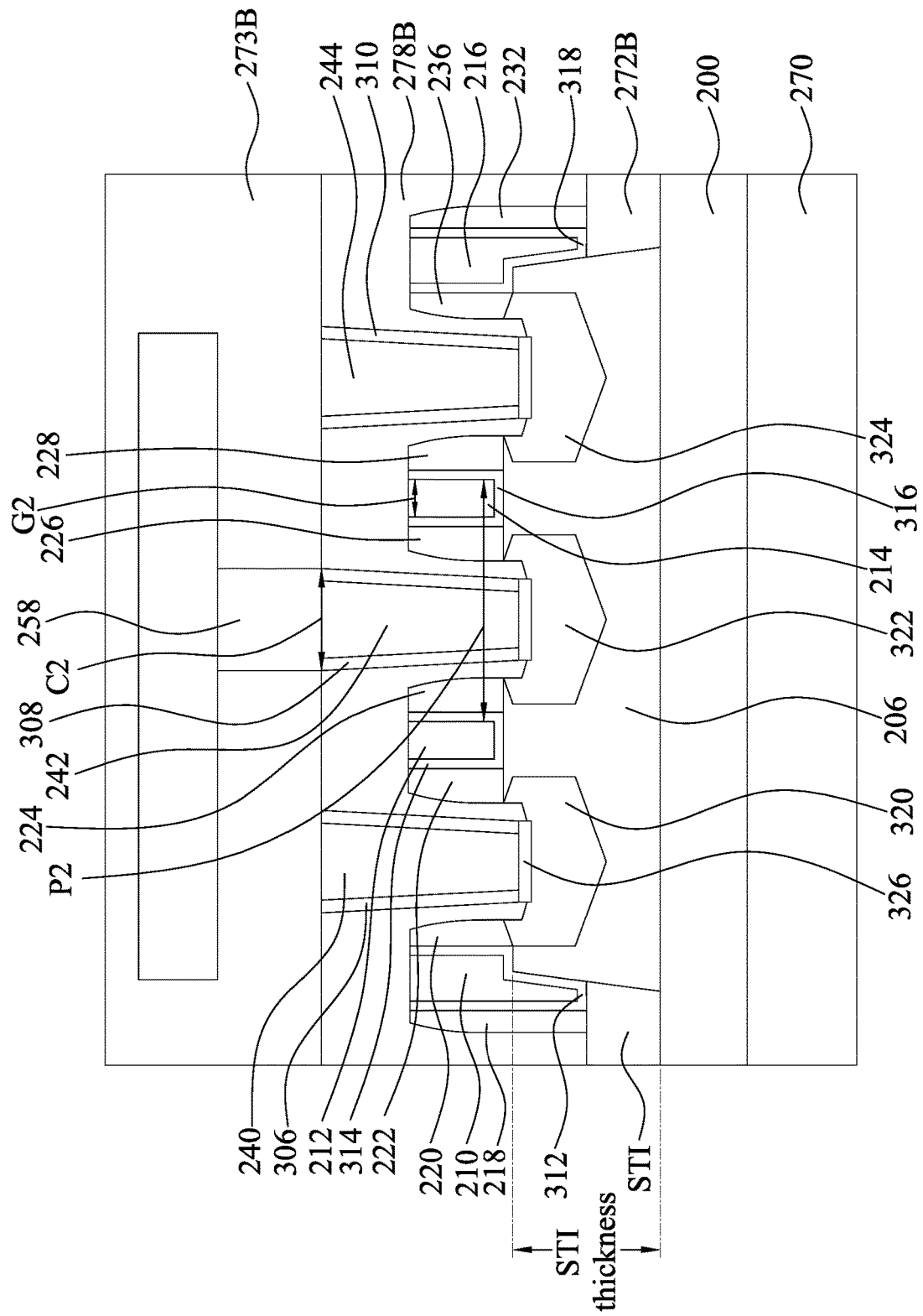
FIGS. 7 and 8 are cross-section views of the semiconductor device having the layout.
Figure 8:
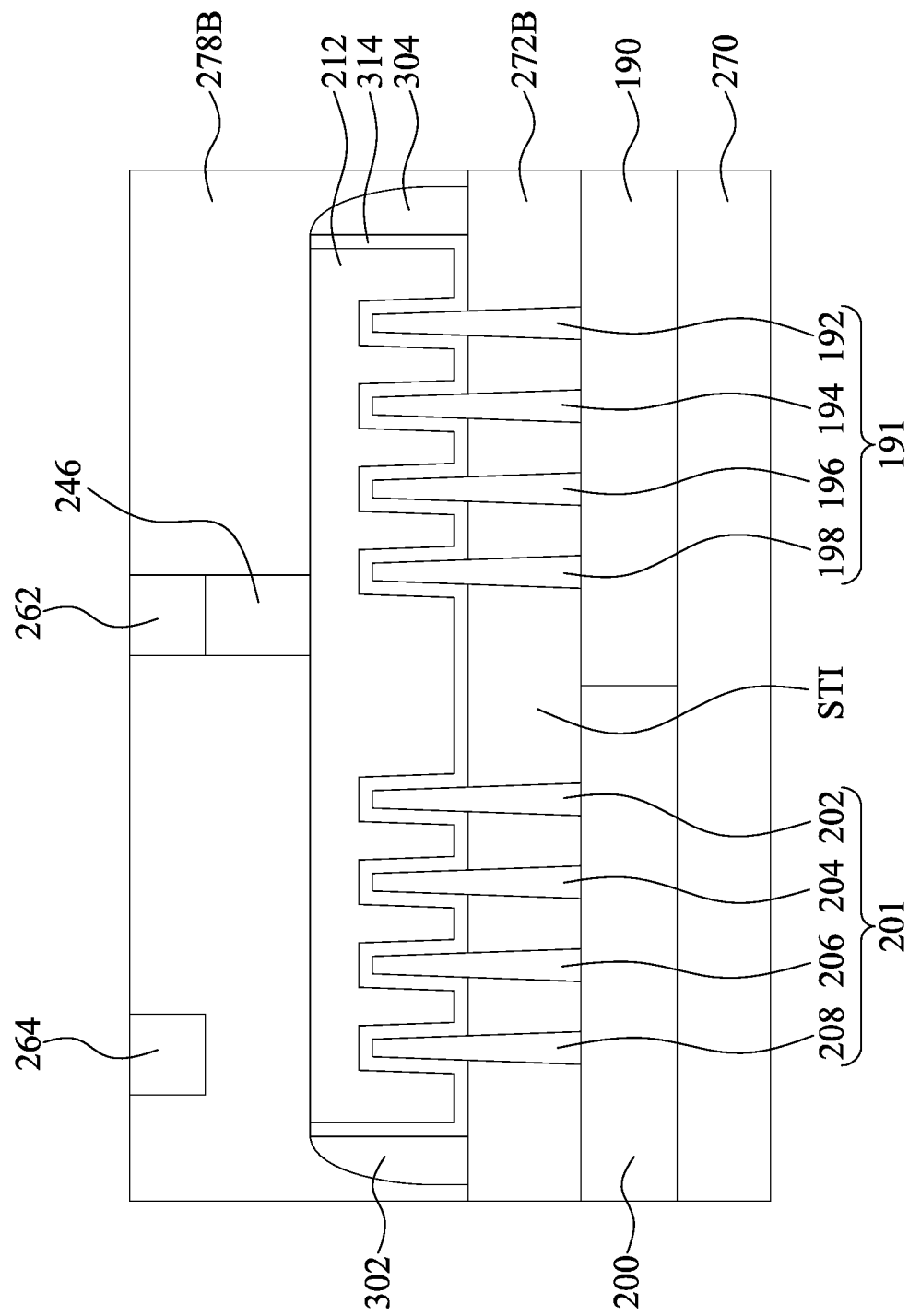

Reference is made to FIGS. 7 and 8. FIGS. 7 and 8 are cross-section views of the semiconductor device 100 having the layout 100A. The cross-section view in FIG. 7 is taken along line 7-7 in FIG. 4. The cross-section view in FIG. 8 is taken along line 8-8 in FIG. 4. The configuration of the semiconductor device 100 is described herein with respect to both FIG. 7 and FIG. 8. The structures shown in FIGS. 7 and 8 can be formed by modelling in a layout as depicted in FIG. 4, and then physical elements or layers are formed by using the gate electrode and the gate contact as patterns.

As illustrated in FIGS. 7 and 8, various elements of the semiconductor device 100 are formed on the substrate 270. Many aspects of the substrate 270 are described in FIGS. 5 and 6, and thus the detailed explanation may be omitted.

The semiconductor device 100 further comprises one or more well regions over the substrate 270. In the example configuration in FIG. 7, the n-well region 200 is over the substrate 270, as described with respect to FIG. 4. In the example configuration in FIG. 8, the n-well region 200 and p-well region 190 are over the substrate 270, as described with respect to FIG. 4.

The semiconductor device 100 further comprises one or more isolation structures over and around the well regions 190, 200. In the example configuration in FIGS. 7 and 8, an isolation structure 272B is over the well regions 190, 200. The isolation structure 272B electrically isolates various elements of the semiconductor device 100 from each other. For example, as illustrated in FIG. 8, the isolation structure 272B electrically isolates the fins 192-198 in the third active area region 191 from the fins 202-208 in the fourth active area region 201. In the cross-section in FIG. 7, the isolation structure 272B has a thickness less than the fin 206; however, outside the cross-section shown in FIG. 7, the isolation structure 272B includes regions where the thickness of the isolation structure 272B is higher, as indicated by the arrow designated with "STI thickness" in FIG. 7. In at least one embodiment, the isolation structure 272B comprises one or more shallow trench isolation (STI) regions. Example materials of the STI regions include, but are not limited to, silicon oxide, silicon nitride, silicon oxynitride, fluoride-doped silicate, and/or any other low k dielectric materials. In some embodiments, the STI thickness is from 50 nm to 200 nm.

In the example configuration in FIGS. 7 and 8, the third and fourth active area regions 191, 201 (best seen in FIG. 8), gate electrodes 210, 212, 214, 216, and corresponding spacers 218, 220, 222, 224, 226, 228, 230, 232 (best seen in FIG. 7), 302, 304 (best seen in FIG. 8) over the isolation structure 272B. In the example configuration in FIGS. 7 and 8, the gate electrodes 210, 212, 214, 216, and the corresponding spacers 218, 220, 222, 224, 226, 228, 230, 232, 302, 304 are over the isolation structure 272B. Other arrangements are within the scope of various embodiments. For example, in one or more embodiments, the gate electrodes 210, 212, 214, 216 and/or one or more of the corresponding spacers 218, 220, 222, 224, 226, 228, 230, 232, 302, 304 are partially embedded in the isolation structure 272B. In addition, In the example configuration in FIG. 8, the spacers 302, 304 may adhere to opposite sidewalls of the gate electrode 212. In some embodiments, the isolation structure 272B and the isolation structure 272A shown in either FIG. 5 or FIG. 6 have the same material. In some embodiments, the isolation structure 272B and the isolation structure 272A shown in either FIG. 5 or FIG. 6 have different materials.

The semiconductor device 100 further comprises an interlayer dielectric (ILD) layer over the isolation structure. In the example configuration in FIGS. 7 and 8, the semiconductor device 100 comprises an ILD layer 278B over the isolation structure 272B. Example materials of the ILD layer 278B include, but are not limited to, $SiN_x$, $SiO_x$, SiON, SiC, SiBN, SiCBN, or combinations thereof. The ILD layer 278B embeds therein the gate electrodes 210, 212, 214, 216, and/or the corresponding spacers 218, 220, 222, 224, 226, 228, 230, 232, 302, 304. The ILD layer 278B further embeds therein the fins 192-198 of the third active area region 191 and the fins 202-208 of the fourth active area region 201 and contact plugs in the corresponding contact areas 240, 242, 244. For the sake of simplicity, the contact plugs are designated by the same reference numerals of the corresponding contact areas.

In the example configuration in FIG. 7, three contact plugs 240, 242, 244 are above the fin 206. Example materials of the contact plugs 240, 242, 244 include, but are not limited to, Ti, TiN, TaN, Co, Ru, Pt, W, Al, Cu, or combinations thereof. In some embodiments, at least one of the contact plugs 240, 242, 244 includes multiple metal material. In some embodiments, the contact plugs 240, 242, 244 are surrounded corresponding barrier layers 306, 308, 310. Example materials of the barrier layers 306, 308, 310 include, Ti, TiN, or combinations thereof.

At least one of the contact plugs 240, 242, 244 is electrically connected to the first interconnection layer of the layout 100A as depicted in FIG. 4. For example, the S/D via 258 between the contact plug 242 and the conductive line 264 is electrically coupled the contact plug 242 to the conductive line 184. In addition, in some embodiments, the semiconductor device 100 may further comprise an IMD layer 273B above the ILD layer 278B, and the IMD layer 273B may embed therein the S/D via 258 and the conductive line 264. In the example configuration in FIG. 8, the gate via 246 is above the gate electrode 212 and between the gate electrode 212 and the conductive line 262 which is in the first interconnection layer of the layout 100A as depicted in FIG. 4. Example materials of the gate via 246 include, but are not limited to, Ti, TiN, TaN, Co, Ru, Pt, W, Al, Cu, or combinations thereof.

The semiconductor device 100 further comprises gate electrodes and gate dielectric layers. In the example configuration in FIGS. 7 and 8, the gate electrodes 210, 212, 214, 216 wrap over the fins 192-198, 202-208 of the third and fourth active area regions 191, 201 in regions where the gate electrodes 210, 212, 214, 216 cross over the fins 192-198, 202-208. To electrically isolate the gate electrodes 210, 212, 214, 216 from the fins 192-198, 202-208, second gate dielectric layers 312, 314, 316, 318 are arranged under and around the corresponding gate electrodes 210, 212, 214, 216. The spacers 218, 220, 222, 224, 226, 228, 230, 232 are over opposite sides of the corresponding second gate dielectric layers 312, 314, 316, 318. Example materials of the second gate dielectric layers 312, 314, 316, 318 include, but are not limited to, a high-k dielectric layer, an interfacial layer, and/or combinations thereof. Example materials for the high-k dielectric layer include, but are not limited to, silicon nitride, silicon oxynitride, hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), metal oxides, metal nitrides, metal silicates, transition metal-oxides, transition metal-nitrides, transition metal-silicates, oxynitrides of metals, metal aluminates, zirconium silicate, zirconium aluminate, zirconium oxide, titanium oxide, aluminum oxide, hafnium dioxide-alumina ($HfO_2$—$Al_2O_3$) alloy, suitable high-k dielectric materials, and/or combinations thereof. In at least one embodiment, a second gate dielectric layer includes multi-layer structure of, for example, $SiO_2$ with a high-k dielectric, or SiON with a high-k dielectric.

In some embodiments, the gate electrodes 210, 212, 214, 216 include one or more conductive layers and/or materials. In the example configuration in FIG. 8, the gate electrode 212 is wrapped over the fins 192-198, 202-208, and includes a first conductive gate material over the p-well region 190 and a second conductive gate material over the n-well region 200. In at least one embodiment, the first and second conductive gate materials include the same conductive material. In at least one embodiment, the first and second conductive gate materials include different conductive materials. In at least one embodiment, the conductive material or materials of at least one of the first and second conductive gate materials is/are selected in accordance with the type of device or transistor. For example, each of the first and second conductive gate materials includes a conductive work function layer and a contact layer over the conductive work function layer.

In at least one embodiment, the work function layer is configured to have a work function in a range from 4 eV to 5 eV. In some embodiments, the first conductive gate material includes an n-type work function metal (n-metal) for forming an NMOS over the p-well region 190. Example n-metals include, but are not limited to, Ta, TiAl, and TiAlN. In some embodiments, the second conductive gate material includes a p-type work function metal (p-metal) for forming a PMOS over the n-well region 200. Example p-metals include, but are not limited to, TiN, TaN, a carbon-doped metal nitride such as TaCN. Other work function materials are within the scope of various embodiments. For example, in one or more embodiments, the work function layer comprises doped conducting oxide materials, TaAl, TiSi, NiSi, PtSi, suitable Ti containing work function materials, suitable Ta containing work function materials, suitable Al containing work function materials, and suitable W containing work function materials.

In at least one embodiment, the contact layer over the conductive work function layer is configured to have a low contact resistance. Example materials of the contact layer include, but are not limited to, polysilicon with silicide, refractory materials such as TiN, TaN, TiW, and TiAl, suitable Ti containing work function materials, suitable Ta containing work function materials, suitable Al containing work function materials, suitable W containing work function materials, suitable Cu containing work function materials, and suitable N containing work function materials.

The first conductive gate material and the second conductive gate material are isolated from the fins 192-198, 202-208 by the corresponding second gate dielectric layer 314. In some embodiments, the second gate dielectric layer 314 has a first portion over the n-well region 200 and a second portion over the p-well region 190. In at least one embodiment, the first and second portions of the second gate dielectric layer 314 include the same dielectric material. In at least one embodiment, the first and second portions of the second gate dielectric layer 314 include different dielectric materials. In the example configuration in FIG. 8, the gate electrode 212 extends continuously from the n-well region 200 into the p-well region 190, and the first conductive gate material is in contact with the second conductive gate material. Other arrangements are within the scope of various embodiments. For example, in at least one embodiment, at least one of the first and second portions of the second gate dielectric layer 314 is interposed between and electrically isolates the first conductive gate material and the second conductive gate material. In at least one embodiment, at least one of the first and second portions of the second gate dielectric layer 314 includes one or more of $HfO_2$, $Ta_2O_5$ and $Al_2O_3$.

In at least one embodiment, the work function layer, the contact layer and the gate dielectric layer configure a gate stack structure. Examples of gate stack structures include, but are not limited to, a metals/high-K dielectric structure, an Al/refractory metals/high-K dielectric structure, a W/refractory metals/high-K dielectric structure, a Cu/refractory metals/high-K dielectric structure, and a silicide/high-K dielectric structure. In at least one embodiment, the gate stack structure includes a $Si_3N_4$/metals/high-K dielectric structure in which the metals are selected from the group consisting of Al/refractory metals, W/refractory metals, Cu/refractory metals, silicide, and combinations thereof.

In the semiconductor device 100, the contact plugs are arranged in the spaces between adjacent spacers. In the example configuration in FIG. 7, the contact plug 242 is arranged in the space between adjacent spacers 224, 226. At least one side face of the contact plug 242 is spaced from an adjacent side face of the spacer 224 or 226, by a portion of the ILD layer 278B. The contact plug 240 is arranged in the space between adjacent spacers 220, 222. At least one side face of the contact plug 240 is spaced from an adjacent side face of the spacer 220 or 222, by a portion of the ILD layer 278B. The contact plug 244 is arranged in the space between adjacent spacers 228, 230. At least one side face of the contact plug 244 is spaced from an adjacent side face of the spacer 228 or 230, by a portion of the ILD layer 278B. In some embodiments, the top surfaces of the contact plugs 240, 242, 244 are flush with each other due to, e.g., a planarization process during manufacture. Other arrangements are within the scope of various embodiments.

In the semiconductor device 100, the contact plugs are in contact with corresponding source/drains. In the example configuration in FIG. 7, the fin 206 includes source/drains 320, 322, 324 which are in contact with the corresponding contact plugs 240, 242, 244. The source/drains 320, 322, 324 are arranged between adjacent gate electrodes 210, 212, 214, 216. In one or more embodiments, portions of the fin 206 between the adjacent spacers are recessed to form S/D cavities having bottom surfaces lower than the top surface of the fin 126. After the formation of the S/D cavities, the source/drains 320, 322, 324 are produced by epi-growing a strained material in the S/D cavities. In at least one embodiment, the lattice constant of the strained material is different from the lattice constant of the substrate 270. Thus, channel regions of the semiconductor device are strained or stressed to enhance carrier mobility of the device. For example, for a PMOS device, the strained material is configured to apply a compressive stress to enhance hole mobility in the at least one source or drain region of the PMOS device. For an NMOS device, the strained material is configured to apply a tensile stress to enhance electron mobility in the at least one source or drain region of the PMOS device. Examples of the strained material include, but are not limited to, SiGe, SiGeC, SiC, GeSn, SiGeSn, SiP, SiCP and other suitable materials. In at least one embodiment, the strained material for a PMOS device comprises SiGe, SiGeC, Ge, Si, or a combination thereof. In at least one embodiment, the strained material for an NMOS device comprises SiC, SiP, SiCP, Si, or a combination thereof.

In some embodiments, at least one silicide region 326 may be formed on the source/drains 320, 322, 324. In some embodiments, at least one metal layer is formed on the corresponding source/drains 320, 322, 324, and then it may cause a reaction between the underlying silicon and the metal material of the metal layer to form the silicide regions 326. In some embodiments, the silicide regions 326 include a material selected from titanium silicide, cobalt silicide, nickel silicide, platinum silicide, erbium silicide, or palladium silicide. In some embodiments, at least one of the source/drains 320, 322, 324 has a concave receiving the corresponding silicide region 326, and the concave may have a receiving width greater than a dimension of the corresponding silicide region 326. Accordingly, the concaves of the source/drains 320, 322, 324 may be filled with a portion of the ILD layer 278B. For example, a portion of the layer 278B is between the source/drain 320 and the corresponding silicide region 326. Furthermore, a top surface of the fin 206 is above the silicide regions 326. For example, the top surface of the fin 206 is in contact with the second gate dielectric layers 314, 316, and an interface between the silicide regions 326 and the corresponding contact plugs 240, 242, 244 is below the top surface of the fin 206. With the concaves of the source/drains 320, 322, 324, an equivalent distance from at least one of the source/drains 320, 322, 324 to the corresponding gate electrodes 210, 212, 214, 216 is lengthened, such that capacitance reduction between the source/drains 320, 322, 324 and the corresponding gate electrodes 210, 212, 214, 216 is achieved.

In the example configuration in FIG. 7, the gate electrodes 210, 212, 214, 216 may define the second gate length. For example, the gate electrode 214 crossing over the fin 206 has the second gate length G2 along the longitudinal direction of the fin 206. In some embodiments, the gate electrodes 210, 212, 214, 216 can be arranged along the X-direction by the second pitch P2 which can be defined by a sum of the second width and the second spacing, as depicted in FIG. 4. For example, the gate electrodes 212 and 214 are arranged along the X-direction by the second pitch P2. In some embodiments, each of the contact plugs 240, 242, 244 respectively corresponding to the contact areas 240, 242, 244 shown in FIG. 4 has the second contact width C2 measured along the X-direction. The second contact width C2 may be referred to as a width of a top surface of at least one of the contact plugs 240, 242, 244. In some embodiments, a length of an interface between the contact plug 242 and the S/D via 258 is less than the second contact width C2.

Reference is made to FIGS. 5 and 7. The first gate dielectric layers 286, 288, 290, 292 may have a first thickness, the first thickness can be referred to as a distance between the fins 126 and the gate electrodes 130, 132, 134, 136. For example, a portion of the first gate dielectric layer 288 is between the fin 126 and the gate electrode 132 and has the first thickness. The second gate dielectric layers 312, 314, 316, 318 may have a second thickness, the second thickness can be referred to as a distance between the fins 206 and the gate electrodes 210, 212, 214, 216. For example, a portion of the second gate dielectric layer 314 is between the fin 206 and the gate electrode 212 and has the second thickness. In some embodiments, the first thickness is substantially the same as the second thickness, and the first gate dielectric layers 286, 288, 290, 292 may have materials the same as those of the second gate dielectric layers 312, 314, 316, 318.

Reference is made to FIGS. 3 and 4. The S/D vias 170, 172, 174, 176, 178, 180 may have a first contact area. For example, the S/D via 178 may have a top surface facing away from the fin 126, and the top surface of the S/D via 178 has the first contact area. The S/D vias 250, 252, 254, 256, 258, 260 may have a second contact area. For example, the S/D via 258 may have a top surface facing away from the fin 206, and the top surface of the S/D via 258 has the second contact area. In some embodiments, the second contact area is greater than the first contact area. In some embodiments, a ratio of the second contact area to the first contact area is greater than 1.2. In some embodiments, a ratio of the second contact area to the first contact area is in a range from 1.2 to 9. Such ratio may be advantageous to avoid yield loss. For example, a planarization process, such as a CMP process can be performed smoothly.

In some embodiments, the first gate length G1 may be substantially the same as the second gate length G2 (i.e., G1=G2). In some embodiments, the second spacing S2 is greater than the first spacing S1. In some embodiments, a ratio of the second spacing S2 to the first spacing S1 is greater than 1.4. In some embodiments, a ratio of the second spacing S2 to the first spacing Si is in a range from 1.4 to 5. In some embodiments, the second contact width C2 is greater than the first contact width C1. In some embodiments, a ratio of the second contact width C2 to the first contact width C1 is greater than 1.2. In some embodiments, a ratio of the second contact width C2 to the first contact width C1 is in a range from 1.2 to 3. In some embodiments, the second pitch P2 is greater than the first pitch P1. In some embodiments, a ratio of the second pitch P2 to the first pitch P1 is greater than 1.3. In some embodiments, a ratio of the second pitch P2 to the first pitch P1 is in a range from 1.3 to 1.8. In some embodiments, the fin 112-118, 122-128 in the first and second active area regions 111, 121 and the fins 192-198, 202-208 in the third and fourth active area regions 191, 201 have the same width measured along the Y-direction. The ratios stated above may be advantageous to avoid yield loss. For example, a planarization process, such as a CMP process can be performed smoothly.

Such dimension differences may be advantageous to provide various applications or functions for different circuits. For example, since the S/D vias of the second circuit 104 have the second contact area greater than the first contact area of the S/D vias of the first circuit 102, resistance reduction of the second circuit 104 is achieved. Accordingly, the second circuit 104 is able to be used in high speed application. For example, the second circuit 104 can be used in a SerDes circuit. On the other hand, the dimension differences may achieve high circuit density of the first circuit 102. As such, with respect to the application of the semiconductor device 100, either high speed or high circuit density is achieved.

In some embodiments, the first contact width C1 can be designed as the same as the second contact width C2, and the first contact area can be designed as the same as the second contact area. In such embodiments, a ratio of the second pitch P2 to the first pitch P1 is in a range from 1.1 to 1.2, and at least one of the source/drains of the fins used in the second circuit has the concave receiving the corresponding silicide region.

Figure 9:
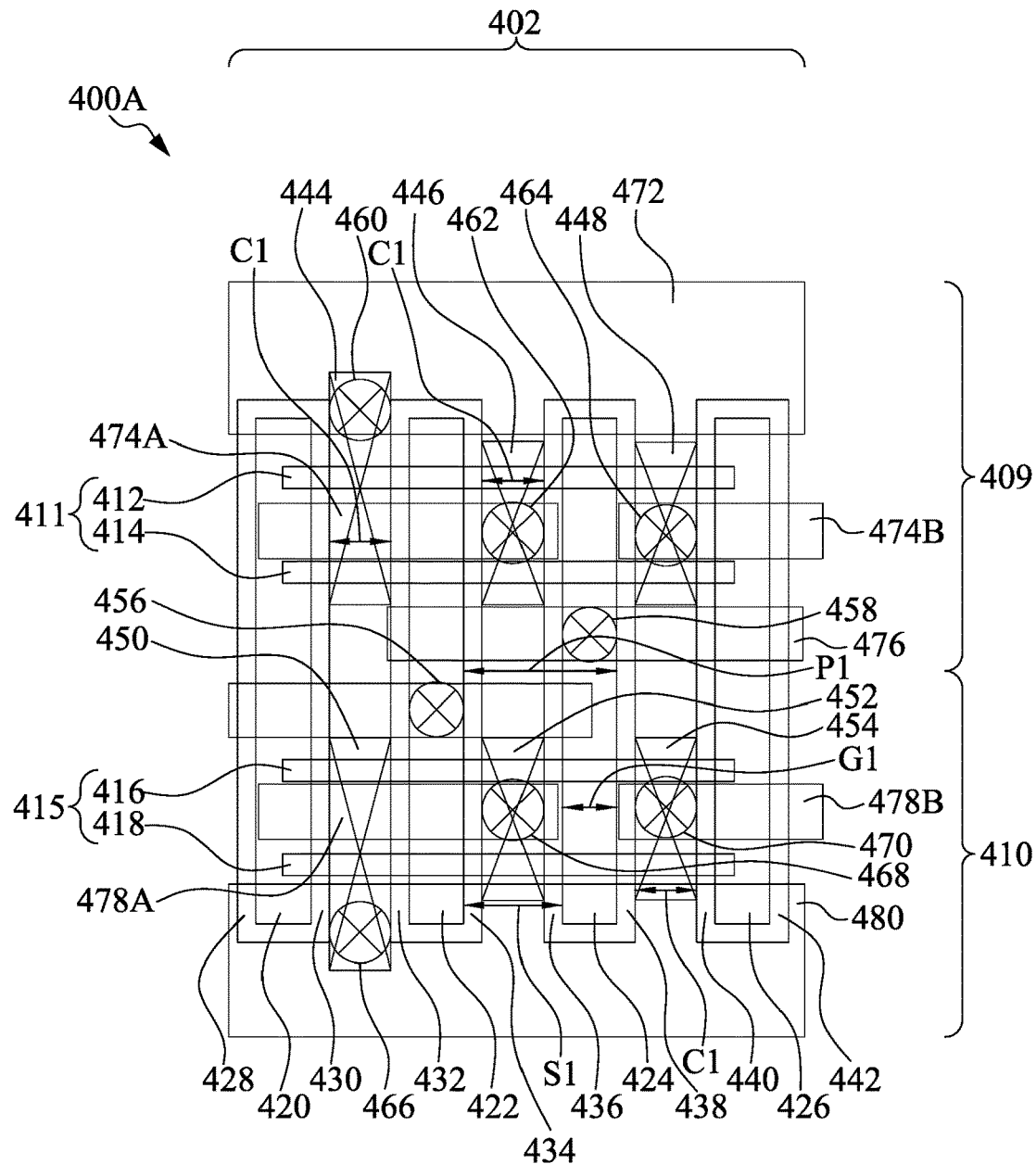
FIG. 9 illustrates a top view of a layout of a first circuit of a semiconductor device.
Figure 10:
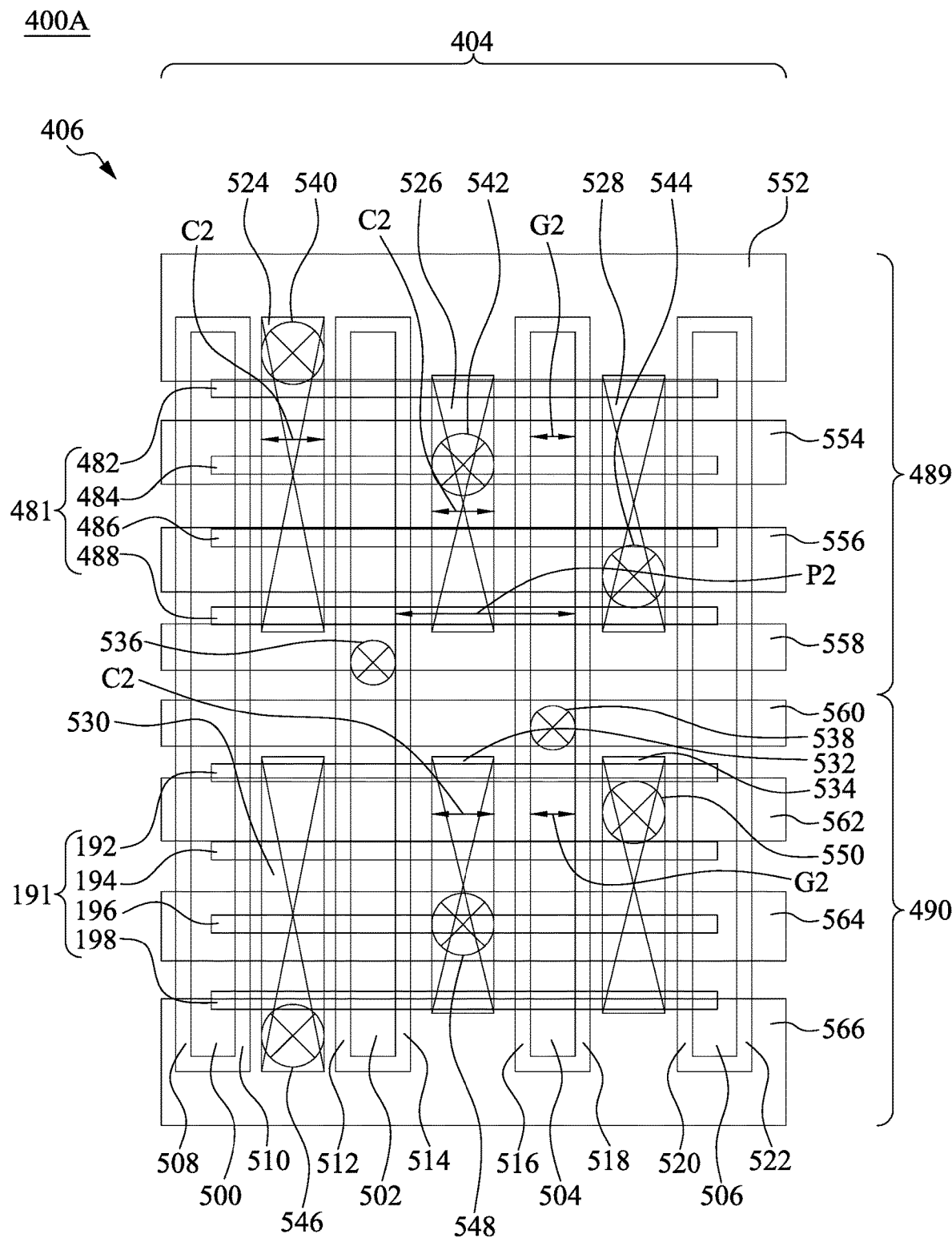
FIG. 10 illustrates a top view of a layout of a second circuit of the semiconductor device.

Reference is made to FIGS. 9 and 10. FIG. 9 illustrates a top view of a layout of a first circuit 402 of a semiconductor device 400. FIG. 10 illustrates a top view of a layout of a second circuit 404 of the semiconductor device 400. Illustrations in FIGS. 9 and 10 can collectively serve as a top view of a layout 400A corresponding to the semiconductor device 400 according to some embodiments of the present disclosure. The semiconductor device 400 includes a first circuit 402 and a second circuit 404. The first circuit 402 and the second circuit 404 are spaced from each other by a region which includes, for example, an isolation structure. In some embodiments, the first circuit 402 may serve as a partial layout of a first device of the semiconductor device 400, and the second circuit 404 may serve as a partial layout of a second device of the semiconductor device 400. In some embodiments, at least one portion of the layout 400A may serve as a partial layout of a SerDes circuit. For example, the second circuit 404 can be used in a SerDes circuit.

Many aspects of the first circuit 402 are the same as or similar to those of the first circuit 102 as depicted in FIG. 3. For example, the first circuit 402 includes a first active area region 411 with fins 412, 414, a second active area region 415 with fins 416, 418, a plurality of gate electrodes 420, 422, 424, 426, a plurality of spacers 428, 430, 432, 434, 436, 438, 440, 442, a plurality of contact areas 444, 446, 448, 450, 452, 454, a plurality of gate vias 456, 458, a plurality of S/D vias 460, 462, 464, 466, 468, 470, and a plurality of conductive lines 472, 474A, 474B, 476, 478A, 478B, 480. The first active area region 411 is within a well region 409 which is a p-well region in one or more embodiments, and the second active area region 415 is within a well region 410 which is an n-well region in one or more embodiments. Different from the first circuit 102, the number of the fins of the first circuit 402 is less than that of the first circuit 102. For example, in the first circuit 102, the number of the fins located within the p-well region 110 is four, and the number of the fins located within the n-well region 120 is four as well. In the first circuit 402, the number of the fins located within the p-well region 409 is two, and the number of the fins located within the n-well region 410 is two as well. Furthermore, the number of the conductive lines 472, 474, 476, 478, 480 is more than two, and the conductive lines 472, 474, 476, 478, 480 extending along X-direction are arranged along the Y-direction. In some embodiments, the uppermost one of the conductive lines has a width measured along the Y-direction and greater than those of the other conductive lines. For example, the conductive line 472 has a width measured along the Y-direction and greater than those of the conductive lines 474, 476, 478. In some embodiments, the bottommost one of the conductive lines has a width measured along the Y-direction and greater than those of the other conductive lines. For example, the conductive line 480 has a width measured along the Y-direction and greater than those of the conductive lines 474, 476, 478.

Many aspects of the second circuit 404 are the same as or similar to those of the second circuit 104 as depicted in FIG. 3. For example, the second circuit 404 includes a third active area region 481 with fins 482, 484, 486, 488, a fourth active area region 491 with fins 492, 494, 496, 498, a plurality of gate electrodes 500, 502, 504, 506, a plurality of spacers 508, 510, 512, 514, 516, 518, 520, 522, a plurality of contact areas 524, 526, 528, 530, 532, 534, a plurality of gate vias 536, 538, a plurality of S/D vias 540, 542, 544, 546, 548, 550, and a plurality of conductive lines 552, 554, 556, 558, 560, 562, 564, 566. The third active area region 481 is within a well region 489 which is a p-well region in one or more embodiments, and the fourth active area region 491 is within a well region 490 which is an n-well region in one or more embodiments. Different from the second circuit 104, the second circuit 404 includes the eight conductive lines 552, 554, 556, 558, 560, 562, 564, 566. The conductive lines 552, 554, 556, 558, 560, 562, 564, 566 extending along X-direction are arranged along the Y-direction. In some embodiments, the uppermost one of the conductive lines has a width measured along the Y-direction and greater than those of the other conductive lines. For example, the conductive line 552 has a width measured along the Y-direction and greater than those of the conductive lines 554, 556, 558. In some embodiments, the bottommost one of the conductive lines has a width measured along the Y-direction and greater than those of the other conductive lines. For example, the conductive line 560 has a width measured along the Y-direction and greater than those of the conductive lines 554, 556, 558.

Furthermore, dimension parameters of the first circuit 402 and the second circuit 404, such as a first gate length G1, a second gate length G2, a first spacing Si, a second spacing S2, a first contact width C1, a second contact width C2, a first pitch P1, and a second pitch P2 can be defined by the same definition as described in FIGS. 3 and 4. The dimension relationship between the first circuit 402 and the second circuit 404, such as the relationship between the first gate length G1 and the second gate length G2, the relationship between the first spacing Si and the second spacing S2, the relationship between the first contact width C1 and the second contact width C2, and the relationship between the first pitch P1 and the second pitch P2, are the same as or similar to those of the layout 100A of the semiconductor device 100 as depicted in FIGS. 3 and 4, and thus the detailed explanation may be omitted.

The number of the fins used in the first circuit 402 is less than the number of the fins used in the second circuit 404. For example, the number of the fins 412, 414 used in the first circuit 402 and located within the p-well region 409 is less than the number of the fins 482, 484, 486, 488 used in the second circuit 404 and located within the p-well region 489. Similarly, the number of the fins 416, 418 used in the first circuit 402 and located within the n-well region 410 is less than the number of the fins 492, 494, 496, 498 used in the second circuit 404 and located within the n-well region 490. In some embodiments, the number of the fins 412, 414, 416, 418 used in the first circuit 402 and located within the p-well region 409 and the n-well region 410 is equal to either the number of the fins 482, 484, 486, 488 used in the second circuit 404 and located within the p-well region 489 or the number of the fins 492, 494, 496, 498 used in the second circuit 404 and located within the n-well region 490.

The number difference between the first circuit 402 and the second circuit 404 may be advantageous to provide different applications. For example, since the fins used in the first circuit 402 is less than the number of the fins used in the second circuit 404, it may achieve high circuit density of the first circuit 402. Accordingly, the first circuit 402 can be used for high circuit density application. On the other hand, the dimension differences between the first circuit 402 and the second circuit 404 may be advantageous to provide resistance reduction of the second circuit 404. Accordingly, the second circuit 404 is able to be used in high speed application. As such, with respect to the application of the semiconductor device 400, either high speed or high circuit density is achieved.

Figure 11:
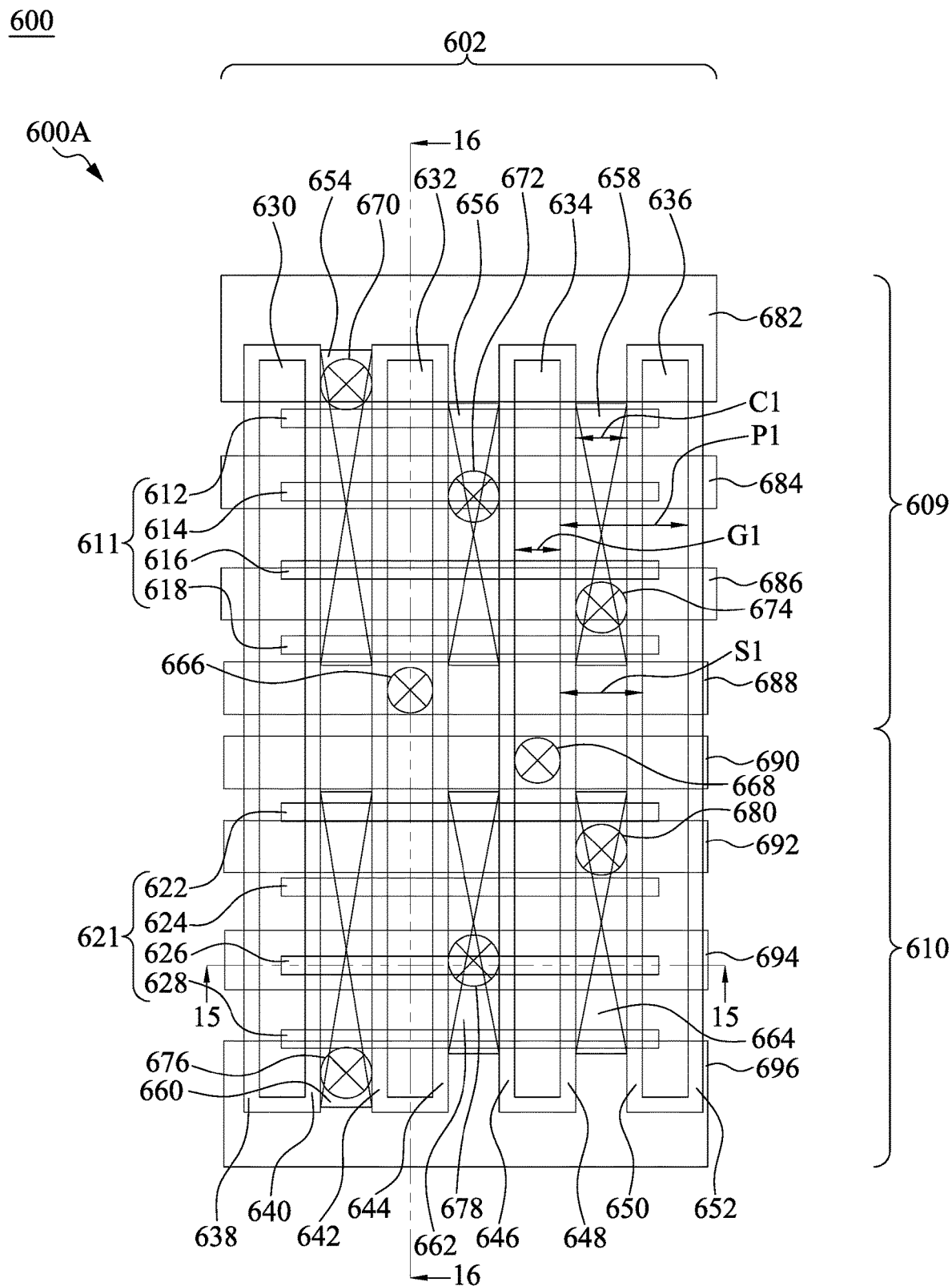
FIG. 11 illustrates a top view of a layout of a first circuit of a semiconductor device.
Figure 12:
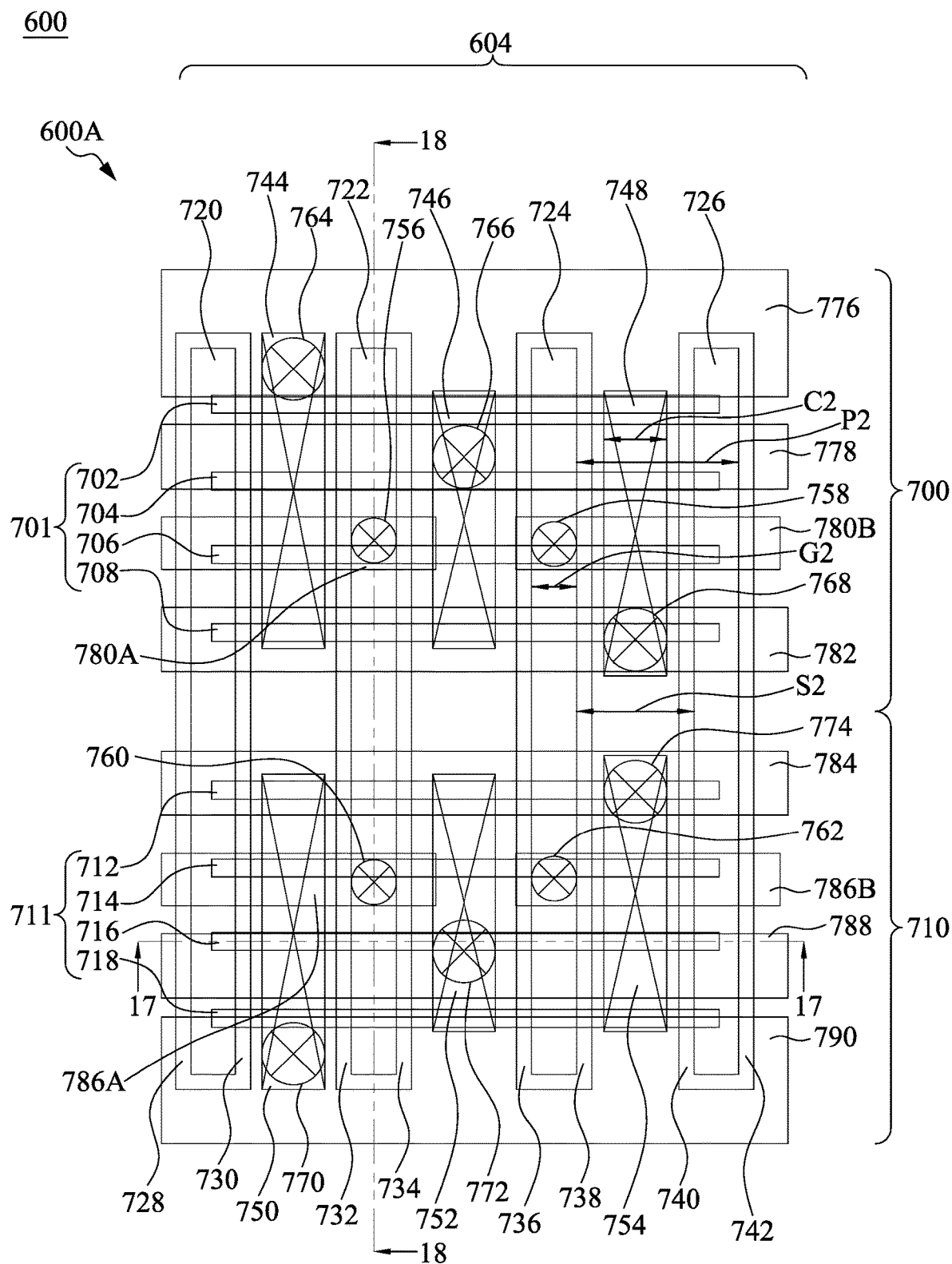
FIG. 12 illustrates a top view of a layout of a second circuit of the semiconductor device.

Reference is made to FIGS. 11 and 12. FIG. 11 illustrates a top view of a layout of a first circuit 602 of a semiconductor device 600. FIG. 12 illustrates a top view of a layout of a second circuit 604 of the semiconductor device 600. Illustrations in FIGS. 11 and 12 can collectively serve as a top view of a layout 600A corresponding to the semiconductor device 600 according to some embodiments of the present disclosure. The semiconductor device 600 includes a first circuit 602 and a second circuit 604. The first circuit 602 and the second circuit 604 are spaced from each other by a region 606 which includes, for example, an isolation structure. In some embodiments, the first circuit 602 may serve as a partial layout of a first device of the semiconductor device 600, and the second circuit 604 may serve as a partial layout of a second device of the semiconductor device 600. In some embodiments, at least one portion of the layout 600A may serve as a partial layout of a SerDes circuit. For example, the second circuit 604 can be used in a SerDes circuit.

Many aspects of the first circuit 602 are the same as or similar to those of the first circuit 102 as depicted in FIG. 3. For example, the first circuit 602 includes a first active area region 611 with fins 412, 414, 616, 618, a second active area region 621 with fins 622, 624, 626, 628, a plurality of gate electrodes 630, 632, 634, 636, a plurality of spacers 638, 640, 642, 644, 646, 648, 650, 652, a plurality of contact areas 654, 656, 658, 660, 662, 664, a plurality of gate vias 666, 668, a plurality of S/D vias 670, 672, 674, 676, 678, 680, and a plurality of conductive lines 682, 684, 686, 688, 690, 692, 694, 696. The first active area region 611 is within a well region 609 which is a p-well region in one or more embodiments, and the second active area region 621 is within a well region 610 which is an n-well region in one or more embodiments. Different from the first circuit 102, the number of the conductive lines 682, 684, 686, 688, 690, 692, 694, 696 is more than two, and the conductive lines 682, 684, 686, 688, 690, 692, 694, 696 extending along X-direction are arranged along the Y-direction. In some embodiments, the uppermost one of the conductive lines has a width measured along the Y-direction and greater than those of the other conductive lines. For example, the conductive line 682 has a width measured along the Y-direction and greater than those of the conductive lines 684, 686, 688, 690, 692, 694. In some embodiments, the bottommost one of the conductive lines has a width measured along the Y-direction and greater than those of the other conductive lines. For example, the conductive line 696 has a width measured along the Y-direction and greater than those of the conductive lines 684, 686, 688, 690, 692, 694.

Many aspects of the second circuit 604 are the same as or similar to those of the second circuit 104 as depicted in FIG. 3. For example, the second circuit 604 includes a third active area region 701 with fins 702, 704, 706, 708, a fourth active area region 711 with fins 712, 714, 716, 718, a plurality of gate electrodes 720, 722, 724, 726, a plurality of spacers 728, 730, 732, 734, 736, 738, 740, 742, a plurality of contact areas 744, 746, 748, 750, 752, 754, a plurality of gate vias 756, 758, 760, 762, a plurality of S/D vias 764, 766, 768, 770, 772, 774, and a plurality of conductive lines 776, 778, 780A, 780B, 782, 784, 786A, 786B, 788, 790. The third active area region 701 is within a well region 700 which is a p-well region in one or more embodiments, and the fourth active area region 711 is within a well region 710 which is an n-well region in one or more embodiments. Different from the second circuit 104, the second circuit 604 includes the eight conductive lines 776, 778, 780A, 780B, 782, 784, 786A, 786B, 788, 790. The conductive lines 776, 778, 780A, 780B, 782, 784, 786A, 786B, 788, 790 extending along X-direction are arranged along the Y-direction. In some embodiments, the uppermost one of the conductive lines has a width measured along the Y-direction and greater than the other conductive lines. For example, the conductive line 776 has a width measured along the Y-direction and greater than the other conductive lines 778, 780A, 780B, 782, 784, 786A, 786B, 788. In some embodiments, the bottommost one of the conductive lines has a width measured along the Y-direction and greater than the other conductive lines. For example, the conductive line 790 has a width measured along the Y-direction and greater than the other conductive lines 778, 780A, 780B, 782, 784, 786A, 786B, 788. In addition, different from the second circuit 104, the number of the gate vias 756, 758, 760, 762 used in the second circuit 604 is more than two. In this regard, at least one of the gate electrodes 720, 722, 724, 726 is coupled to other circuitry by more than one gate via. For example, the gate vias 756, 760 are formed on the gate electrode 722 and configured to electrically couple to the gate electrode 722 to other circuitry. In some embodiments, the gate vias 756, 760 may overlap the gate electrode 722 and have vertical projections projected on the gate electrode 722. Similarly, the gate vias 758, 762 are formed on the gate electrode 724 and configured to electrically couple to the gate electrode 724 to other circuitry. In some embodiments, the gate vias 758, 762 may overlap the gate electrode 724 and have vertical projections projected on the gate electrode 724.

Furthermore, dimension parameters of the first circuit 602 and the second circuit 604, such as a first gate length G1, a second gate length G2, a first spacing Si, a second spacing S2, a first contact width C1, a second contact width C2, a first pitch P1, and a second pitch P2 can be defined by the same definition as described in FIGS. 3 and 4. The dimension relationship between the first circuit 602 and the second circuit 604, such as the relationship between the first gate length G1 and the second gate length G2, the relationship between the first spacing Si and the second spacing S2, the relationship between the first contact width C1 and the second contact width C2, and the relationship between the first pitch P1 and the second pitch P2, are the same as or similar to those of the layout 100A of the semiconductor device 100 as depicted in FIGS. 3 and 4, and thus the detailed explanation may be omitted.

Figure 13:
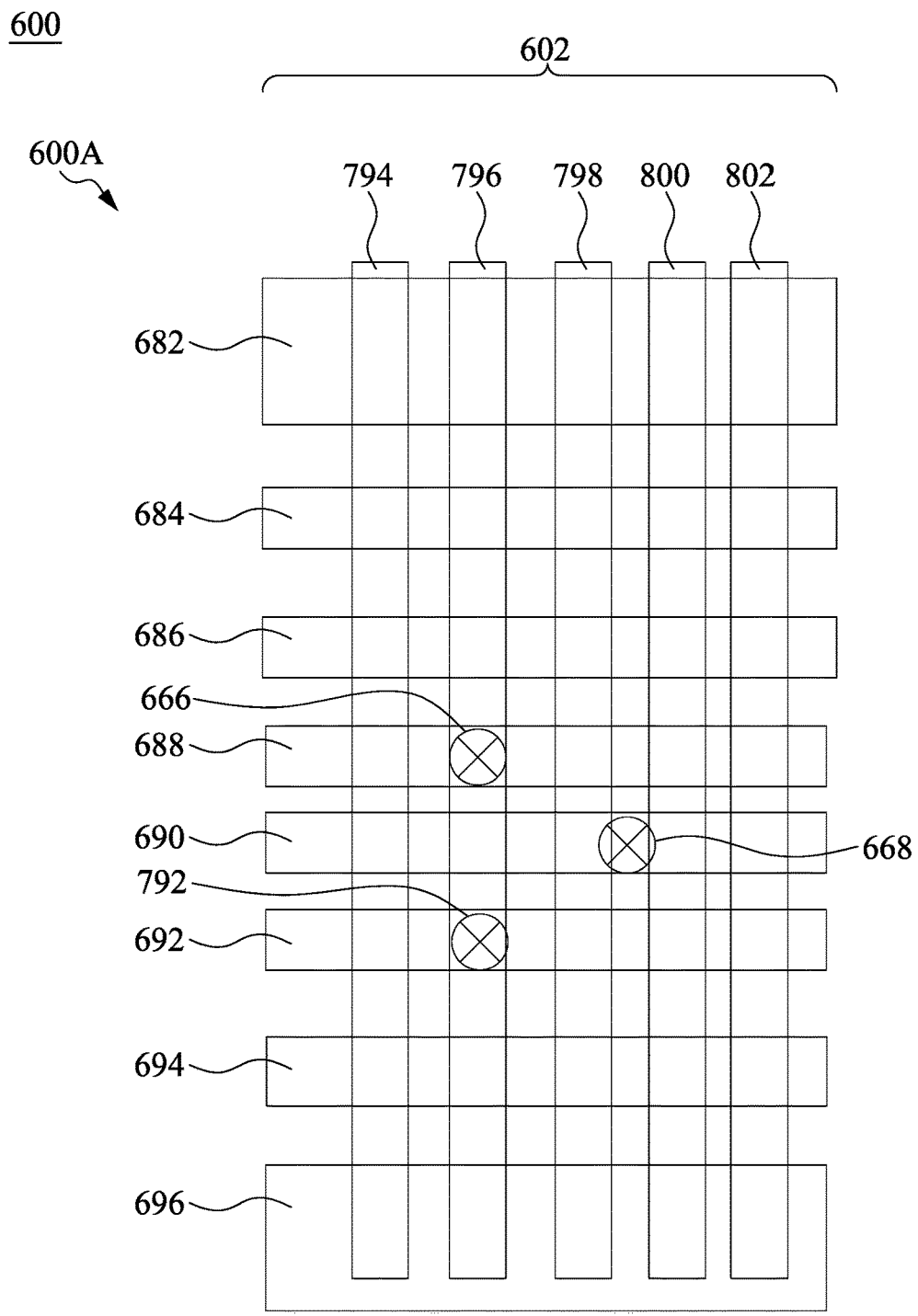
FIG. 13 illustrates a top view of a layout of the first circuit of the semiconductor device.
Figure 14:
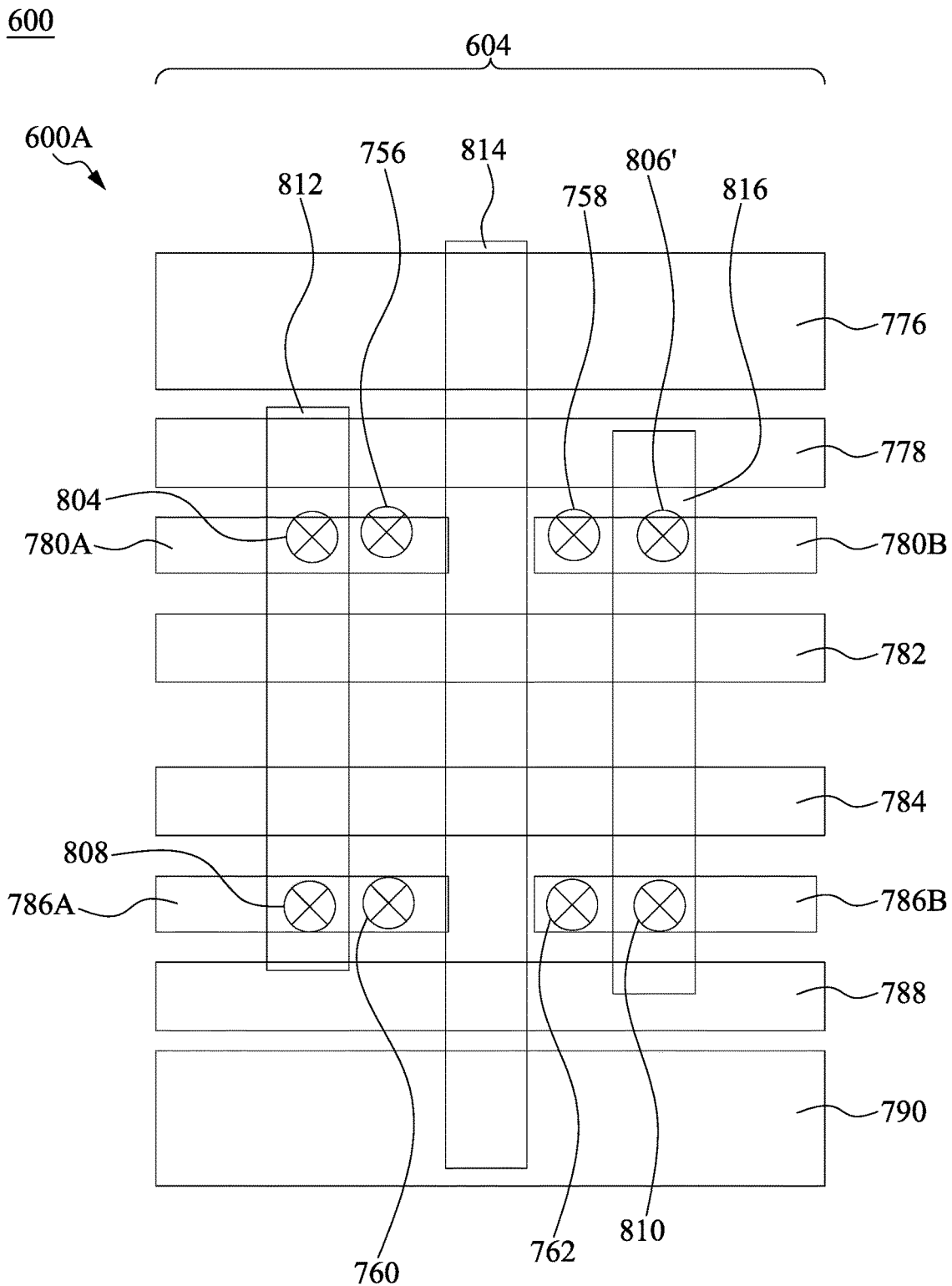
FIG. 14 illustrates a top view of a layout of the second circuit of the semiconductor device.

Reference is made to FIGS. 13 and 14. FIG. 13 illustrates a top view of a layout of the first circuit 602 of the semiconductor device 600. FIG. 14 illustrates a top view of a layout of the second circuit 604 of the semiconductor device 600. Illustrations in FIGS. 13 and 14 can collectively serve as a top view of the layout 600A corresponding to the semiconductor device 600 according to some embodiments of the present disclosure. For the sake of simplicity, FIGS. 13 and 14 illustrate the conductive lines 682, 684, 686, 688, 690, 692, 694, 696, 778, 780A, 780B, 782, 784, 786A, 786B, 788, the gate vias 666, 668, 756, 758, 760, 762, and elements above the conductive lines 682, 684, 686, 688, 690, 692, 694, 696, 778, 780A, 780B, 782, 784, 786A, 786B, 788. For example, the first circuit 602 further includes conductive via 792 and conductive lines 794, 796, 798, 800, 802, and the second circuit 604 further includes conductive via 804, 806, 808, 810 and conductive lines 812, 814, 816.

In the first circuit 602, the conductive lines 794, 796, 798, 800, 802 extend along the Y-direction of the layout 100A and are arranged along the X-direction of the layout 100A. In some embodiments, the conductive lines 794, 796, 798, 800, 802 are in a second interconnection layer of the layout 100A, such as a second metal layer above the first metal layer. The conductive lines 794, 796, 798, 800, 802 overlap and are electrically connected to corresponding elements. For example, at least one of the conductive lines 794, 796, 798, 800, 802 overlaps with the conductive lines 682, 684, 686, 688, 690, 692, 694, 696. In some embodiments, at least one of the conductive lines 794, 796, 798, 800, 802 is electrically connected to the corresponding conductive lines 794, 796, 798, 800, 802 through a conductive via. For example, the conductive via 792 overlaps with the conductive line 692, 796, and thus the conductive line 692 can be electrically coupled to the conductive line 796 by the conductive via 792.

In the second circuit 604, the conductive lines 812, 814, 816 extend along the Y-direction of the layout 100A and are arranged along the X-direction of the layout 100A. In some embodiments, the conductive lines 812, 814, 816 are in the second interconnection layer of the layout 100A. The conductive lines 812, 814, 816 overlap and are electrically connected to corresponding elements. For example, at least one of the conductive lines 812, 816 overlaps with the conductive lines 778, 780A, 780B, 782, 784, 786A, 786B, 788, and the conductive line 814 at least overlaps with the conductive lines 776, 778, 782, 784, 788, 790. Furthermore, the conductive line 814 has a length measured along the Y-direction, and the length of the conductive line 814 is greater than those of the conductive lines 812, 816. Furthermore, the conductive lines 780A and 780B extend along the X-direction of the layout 100A and are arranged along the X-direction of the layout 100A. In some embodiments, the conductive line 780A is aligned with the conductive line 780B in the X-direction of the layout 100A. In some embodiments, the conductive lines 780A and 780B are discontinuous in the X-direction of the layout 100A. Similarly, the conductive lines 786A and 786B extend along the X-direction of the layout 100A and are arranged along the X-direction of the layout 100A. In some embodiments, the conductive line 786A is aligned with the conductive line 786B in the X-direction of the layout 100A. In some embodiments, the conductive lines 786A and 786B are discontinuous in the X-direction of the layout 100A.

Figure 15:
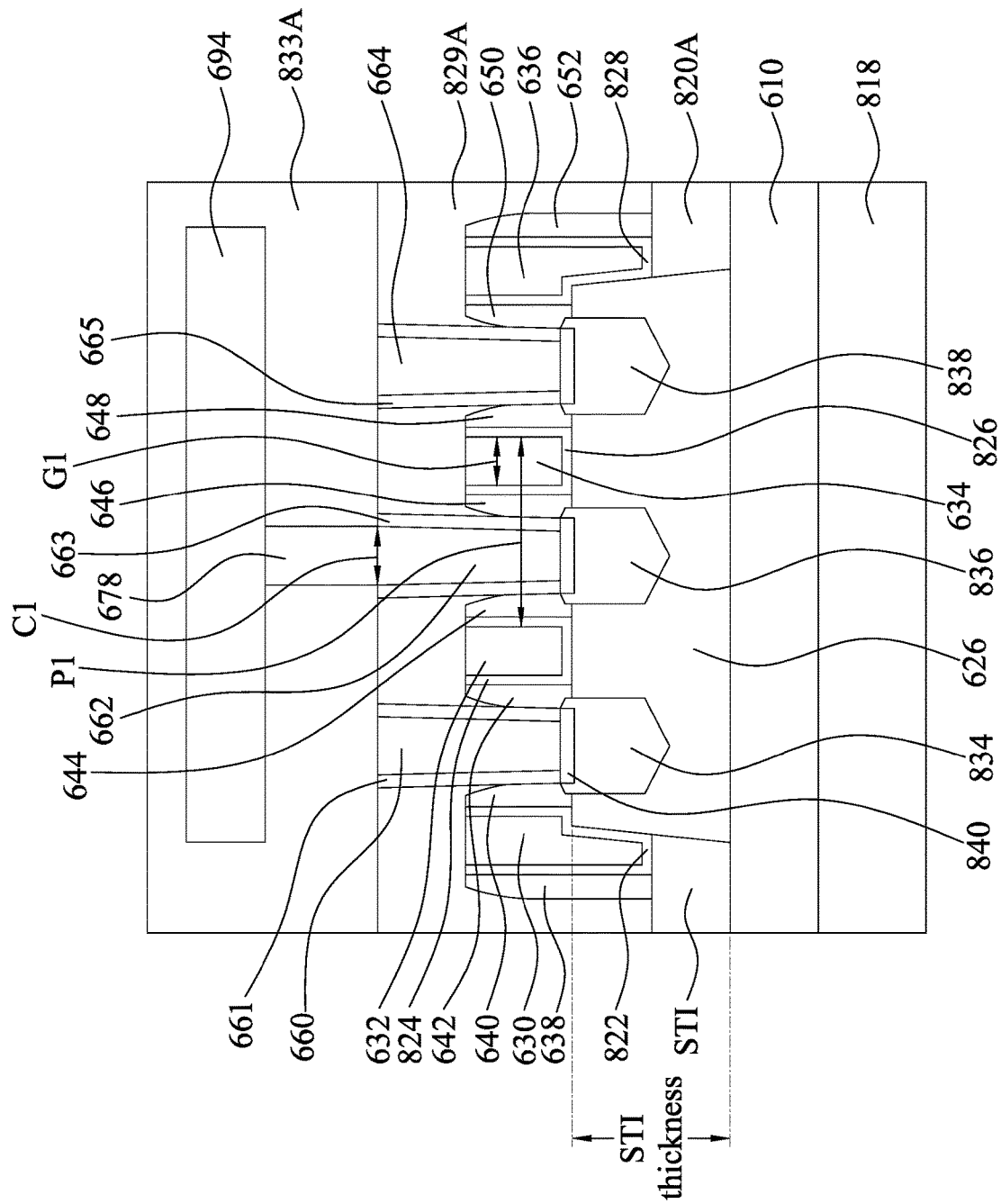
FIGS. 15 and 16 are cross-section views of the semiconductor device having the layout.
Figure 16:
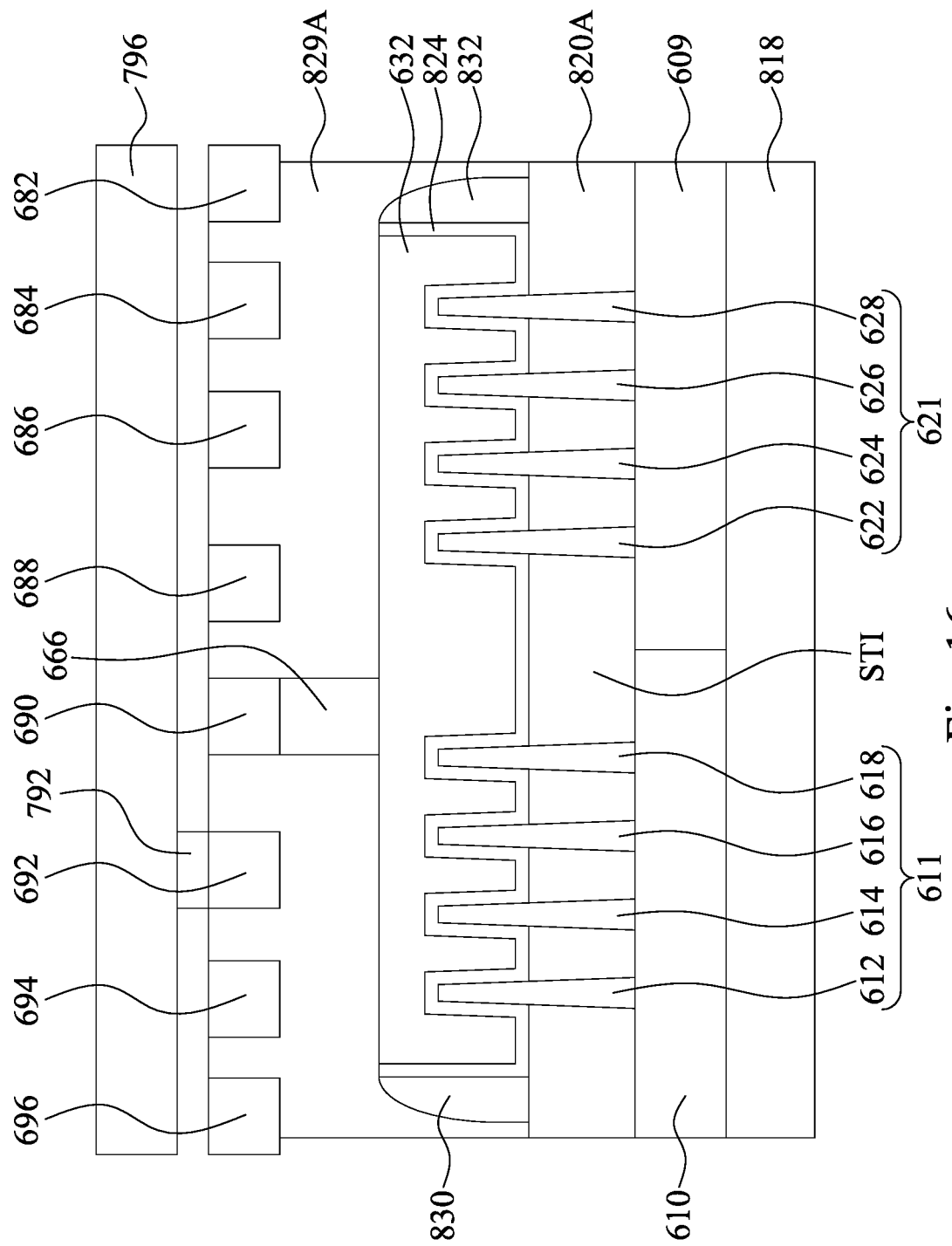

Reference is made to FIGS. 15 and 16. FIGS. 15 and 16 are cross-section views of the semiconductor device 600 having the layout 600A. The cross-section view in FIG. 15 is taken along line 15-15 in FIG. 11. The cross-section view in FIG. 16 is taken along line 16-16 in FIG. 11. The configuration of the semiconductor device 600 is described herein with respect to both FIG. 15 and FIG. 16.

Many aspects of the configurations of the semiconductor device 600 depicted in FIGS. 15 and 16 are the same as or similar to those of the semiconductor device 100 as depicted in FIGS. 5 and 6. For example, the semiconductor device 600 includes a substrate 818, an isolation structure 820A, first gate dielectric layers 822, 824, 826, 828, an ILD layer 829A, a pair of spacer 830, 832, an IMD layer 833A, source/drains 834, 836, 838, and silicide regions 840. For the sake of simplicity, the contact plugs are designated by the same reference numerals of the corresponding contact areas. For example, the contact plugs 660, 662, 664 are respectively above the source/drains 834, 836, 838 and are respectively surrounded by barrier layers 661, 663, 665. Accordingly, the detailed explanation regarding these elements may be omitted. Different from the semiconductor device 100, in the example configuration in FIG. 16, the illustration shows the conductive lines 682, 684, 686, 688, 690, 692, 694, 696, 796, and the conductive via 792. In the example configuration in FIG. 16, the gate via 666 is between the gate electrode 632 and the conductive line 690, and the gate electrode 632 is electrically coupled to the conductive line 690 through the gate via 666. The conductive via 792 is between the conductive line 692 and the conductive line 796, and the conductive line 692 is electrically coupled to the conductive line 796 through the conductive via 792.

Figure 17:
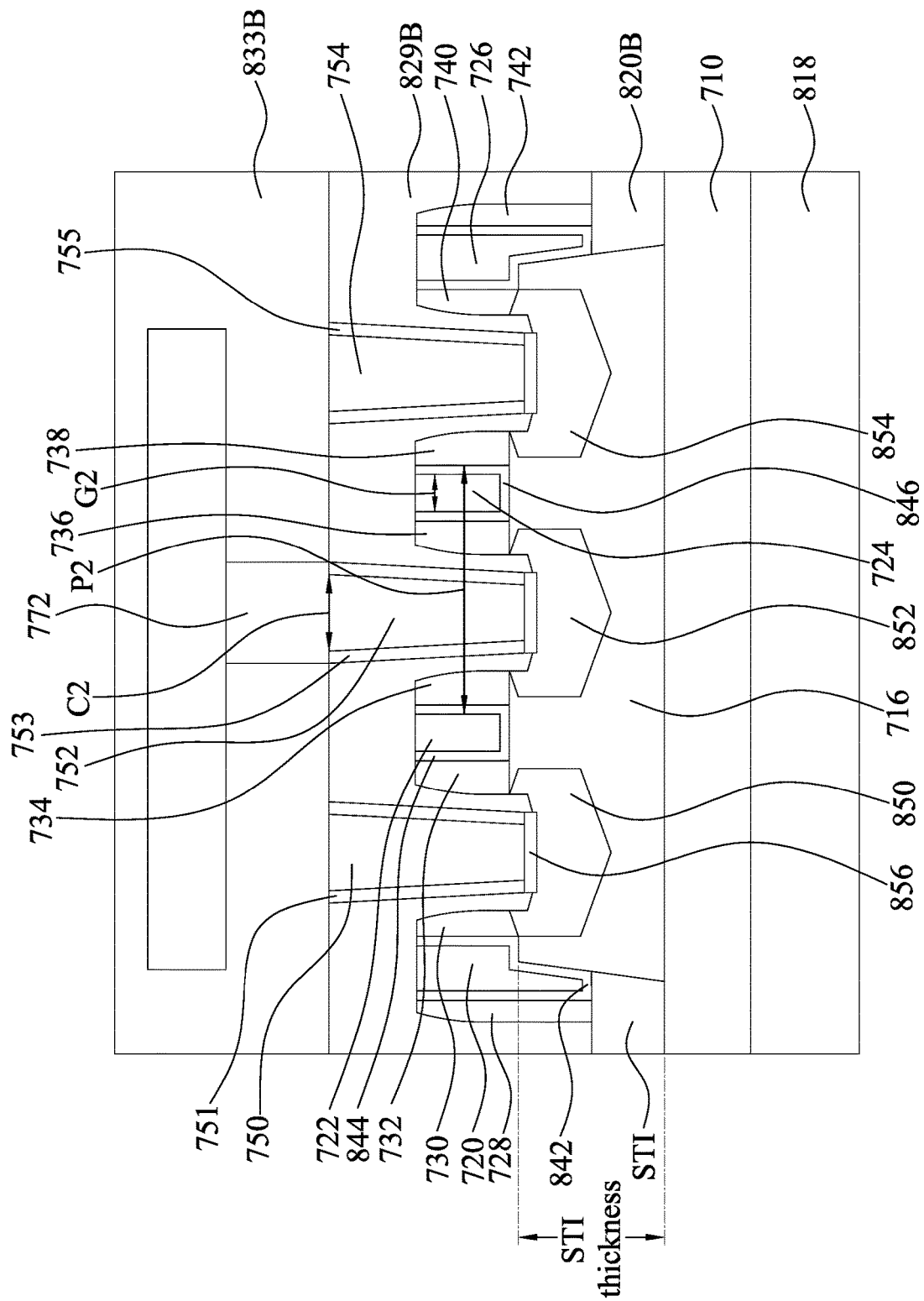
FIGS. 17 and 18 are cross-section views of the semiconductor device having the layout.
Figure 18:
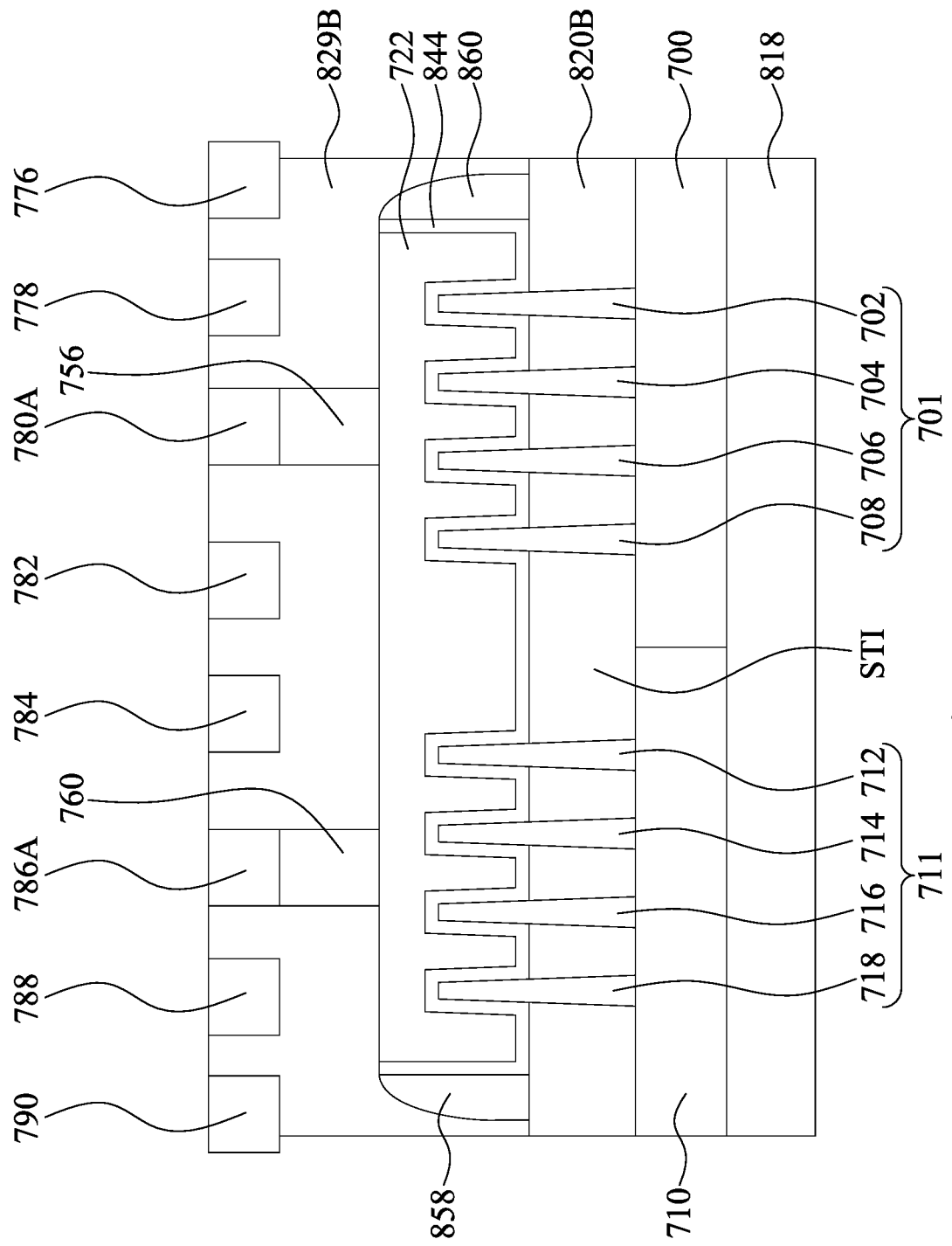

Reference is made to FIGS. 17 and 18. FIGS. 17 and 18 are cross-section views of the semiconductor device 600 having the layout 600A. The cross-section view in FIG. 17 is taken along line 17-17 in FIG. 12. The cross-section view in FIG. 18 is taken along line 18-18 in FIG. 12. The configuration of the semiconductor device 600 is described herein with respect to both FIG. 17 and FIG. 18.

Many aspects of the configurations of the semiconductor device 600 depicted in FIGS. 17 and 18 are the same as or similar to those of the semiconductor device 100 as depicted in FIGS. 7 and 8. For example, the semiconductor device 600 includes an isolation structure 820B, second gate dielectric layers 842, 844, 846, 848, an ILD layer 829B, a pair of spacer 858, 860, source/drains 850, 852, 854, and silicide regions 856. For the sake of simplicity, the contact plugs are designated by the same reference numerals of the corresponding contact areas. For example, the contact plugs 750, 752, 754 are respectively above the source/drains 850, 852, 854 and are respectively surrounded by barrier layers 751, 753, 755. Accordingly, the detailed explanation regarding these elements may be omitted. Different from the semiconductor device 100, in the example configuration in FIG. 14, the illustration shows the conductive lines 776, 778, 780A, 782, 784, 786A, 788, 790, and the two gate via 756, 760. In the example configuration in FIG. 12, the gate via 756 is between the gate electrode 722 and the conductive line 780A, and the gate electrode 722 is electrically coupled to the conductive line 780A through the gate via 756. The gate via 760 is between the gate electrode 722 and the conductive line 786A, and the gate electrode 722 is electrically coupled to the conductive line 786A through the gate via 760. Accordingly, the number of the gate vias electrically coupled to the gate electrode 722 is more than one.

The number difference between the first circuit 602 and the second circuit 604 may be advantageous to provide different applications. For example, since the number of gate via for electrically coupling one gate electrode used in the first circuit 602 is less than the gate vias for electrically coupling one gate electrode used in the second circuit 604, it may enhance resistance reduction of the second circuit 604. Accordingly, the second circuit 604 is able to be used in high speed application. On the other hand, the dimension differences between the first circuit 602 and the second circuit 604 remain, so as to provide high circuit density of the first circuit 602. As such, with respect to the application of the semiconductor device 600, either high speed or high circuit density is achieved.

Figure 19:
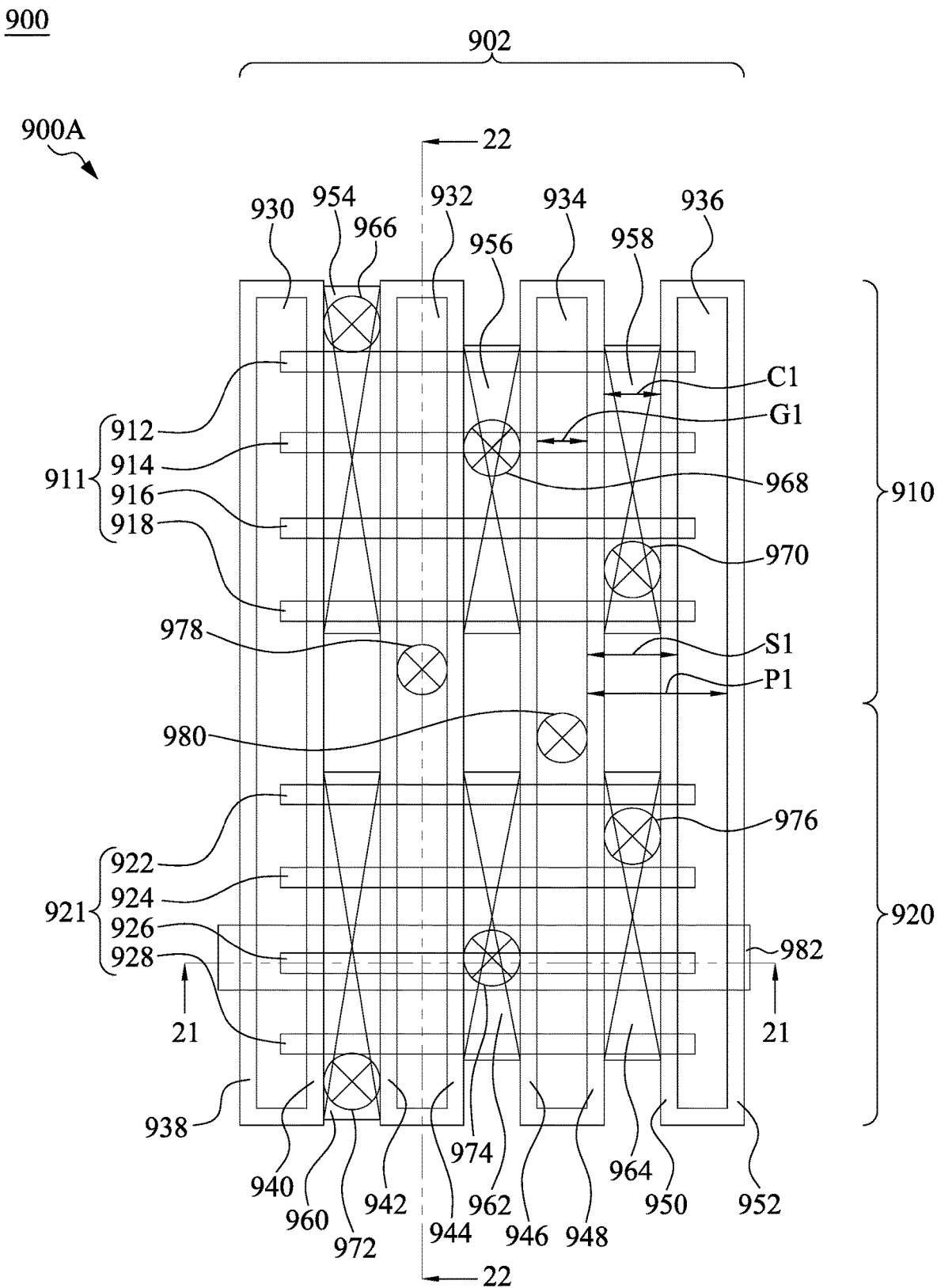
FIG. 19 illustrates a top view of a layout of a first circuit of a semiconductor device.
Figure 20:
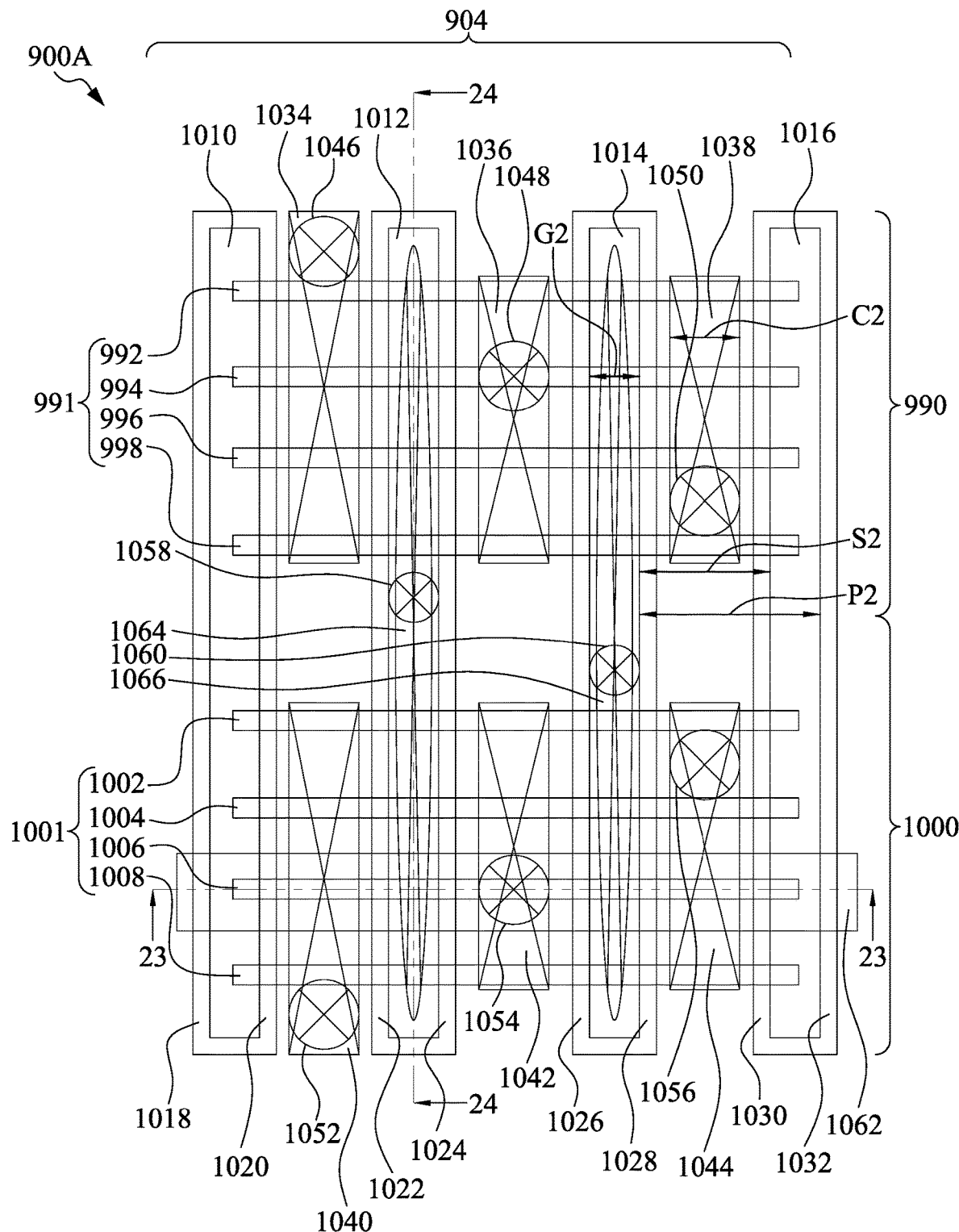
FIG. 20 illustrates a top view of a layout of a second circuit of the semiconductor device.

Reference is made to FIGS. 19 and 20. FIG. 19 illustrates a top view of a layout of a first circuit 902 of a semiconductor device 900. FIG. 20 illustrates a top view of a layout of a second circuit 904 of the semiconductor device 900. Illustrations in FIGS. 19 and 20 can collectively serve as a top view of a layout 900A corresponding to the semiconductor device 900 according to some embodiments of the present disclosure. The semiconductor device 900 includes a first circuit 902 and a second circuit 904. The first circuit 902 and the second circuit 904 are spaced from each other by a region which includes, for example, an isolation structure. In some embodiments, the first circuit 902 may serve as a partial layout of a first device of the semiconductor device 900, and the second circuit 904 may serve as a partial layout of a second device of the semiconductor device 900. In some embodiments, at least one portion of the layout 900A may serve as a partial layout of a SerDes circuit. For example, the second circuit 904 can be used in a SerDes circuit.

Many aspects of the first circuit 902 are the same as or similar to those of the first circuit 102 as depicted in FIG. 3. For example, the first circuit 902 includes a first active area region 911 with fins 912, 914, 916, 918, a second active area region 921 with fins 922, 924, 926, 928, a plurality of gate electrodes 930, 932, 934, 936, a plurality of spacers 938, 940, 942, 944, 946, 948, 950, 952, a plurality of contact areas 954, 956, 958, 960, 962, 964, a plurality of S/D vias 966, 968, 970, 972, 974, 976, a plurality of gate vias 978, 980, and a conductive line 982. The first active area region 911 is within a well region 910 which is a p-well region in one or more embodiments, and the second active area region 921 is within a well region 920 which is an n-well region in one or more embodiments. Thus, the detailed explanation with respect to the first circuit 902 may be omitted.

Many aspects of the second circuit 904 are the same as or similar to those of the second circuit 104 as depicted in FIG. 3. For example, the second circuit 604 includes a third active area region 991 with fins 992, 994, 996, 998, a fourth active area region 1001 with fins 1002, 1004, 1006, 1008, a plurality of gate electrodes 1010, 1012, 1214, 1016, a plurality of spacers 1018, 1020, 1022, 1024, 1026, 1028, 1030, 1032, a plurality of contact areas 1034, 1036, 1038, 1040, 1042, 1044, a plurality of S/D vias 1046, 1048, 1050, 1052, 1054, 1056, a plurality of gate vias 1058, 1060, and a conductive line 1062. The third active area region 991 is within a well region 990 which is a p-well region in one or more embodiments, and the fourth active area region 1001 is within a well region 1000 which is an n-well region in one or more embodiments. Different from the second circuit 104, the second circuit 904 includes gate contacts 1064, 1066. The gate contact 1064 is between the spacer 1022 and 1024 and overlaps with the gate electrode 1012 and the gate via 1058. In some embodiments, the gate contact 1064 extends across the fins 992-998 and 1002-1008. In some embodiments, the gate electrode 1012 is electrically coupled to the gate via 1058 through the gate contact 1064. The gate contact 1066 is between the spacer 1026 and 1028 and overlaps with the gate electrode 1014 and the gate via 1060.

In some embodiments, the gate contact 1066 extends across the fins 992-998 and 1002-1008. In some embodiments, the gate electrode 1014 is electrically coupled to the gate via 1060 through the gate contact 1066.

Furthermore, dimension parameters of the first circuit 902 and the second circuit 904, such as a first gate length G1, a second gate length G2, a first spacing Si, a second spacing S2, a first contact width C1, a second contact width C2, a first pitch P1, and a second pitch P2 can be defined by the same definition as described in FIGS. 3 and 4. The dimension relationship between the first circuit 602 and the second circuit 604, such as the relationship between the first gate length G1 and the second gate length G2, the relationship between the first spacing Si and the second spacing S2, the relationship between the first contact width C1 and the second contact width C2, and the relationship between the first pitch P1 and the second pitch P2, are the same as or similar to those of the layout 100A of the semiconductor device 100 as depicted in FIGS. 3 and 4, and thus the detailed explanation may be omitted.

Figure 21:
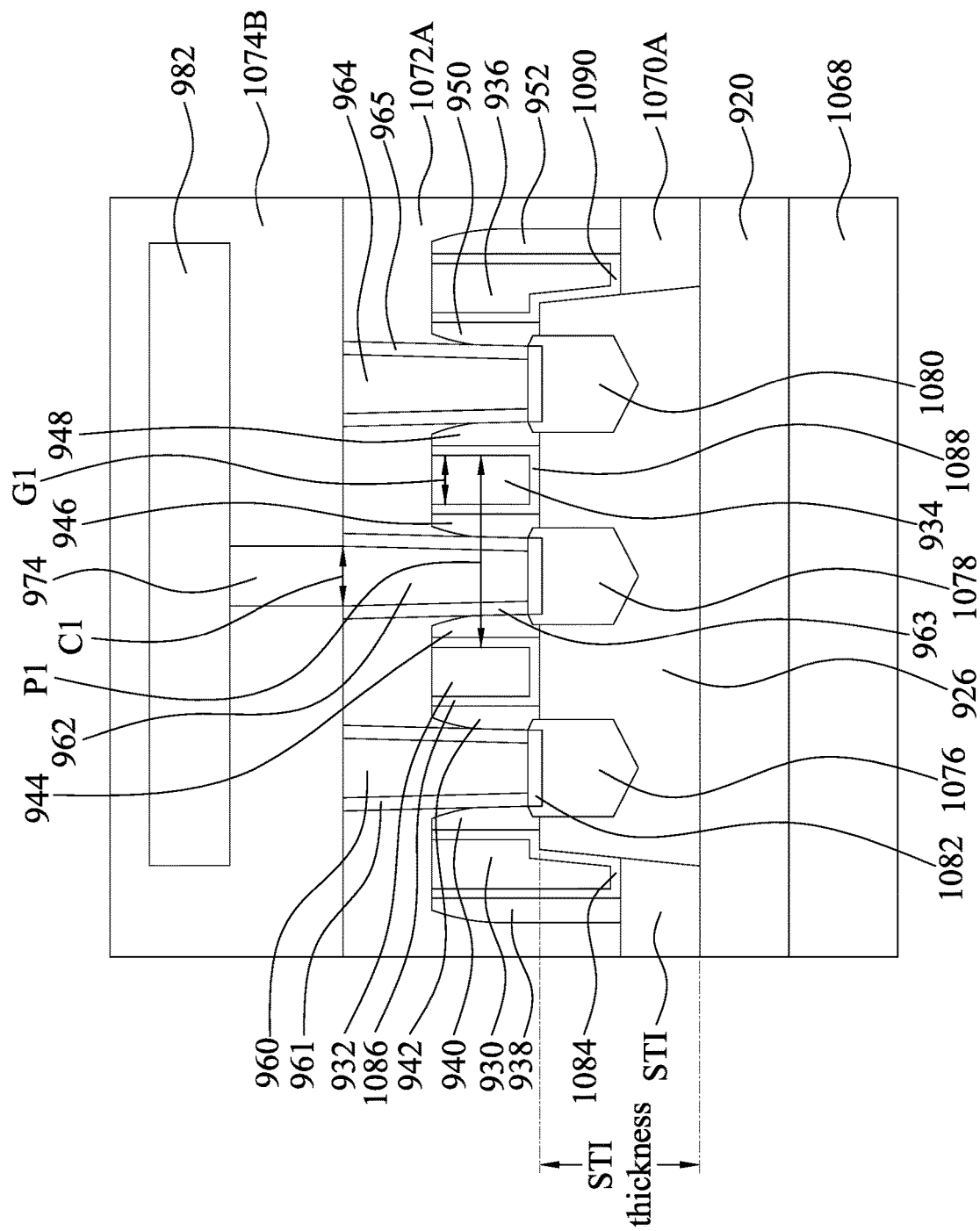
FIGS. 21 and 22 are cross-section views of the semiconductor device having the layout.
Figure 22:
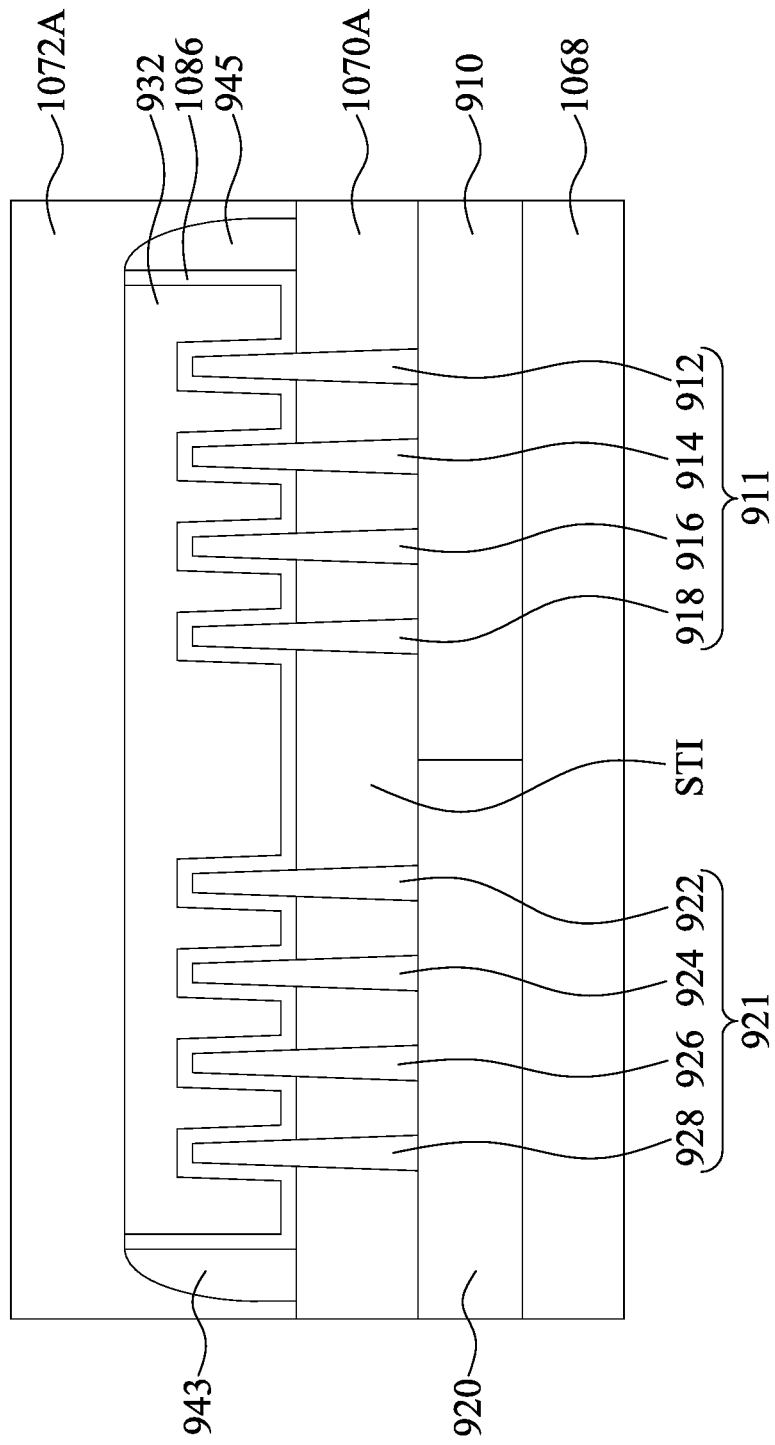

Reference is made to FIGS. 21 and 22. FIGS. 21 and 22 are cross-section views of the semiconductor device 900 having the layout 900A. The cross-section view in FIG. 21 is taken along line 21-21 in FIG. 19. The cross-section view in FIG. 22 is taken along line 22-22 in FIG. 19. The configuration of the semiconductor device 900 is described herein with respect to both FIG. 21 and FIG. 22.

Many aspects of the configurations of the semiconductor device 900 depicted in FIGS. 21 and 22 are the same as or similar to those of the semiconductor device 100 as depicted in FIGS. 5 and 6. For example, the semiconductor device 900 includes a substrate 1068, an isolation structure 1070A, first gate dielectric layers 1084, 1086, 1088, 1090, an ILD layer 1072A, spacers 938, 940, 942, 943, 944, 945, 946, 948, 950, 952, an IMD layer 1074A, source/drains 1076, 1078, 1080, and silicide regions 1082. For the sake of simplicity, the contact plugs are designated by the same reference numerals of the corresponding contact areas. For example, the contact plugs 960, 962, 964 are respectively above the source/drains 1076, 1078, 1080 and are respectively surrounded by barrier layers 961, 963, 965. Accordingly, the detailed explanation regarding these elements may be omitted.

Figure 23:
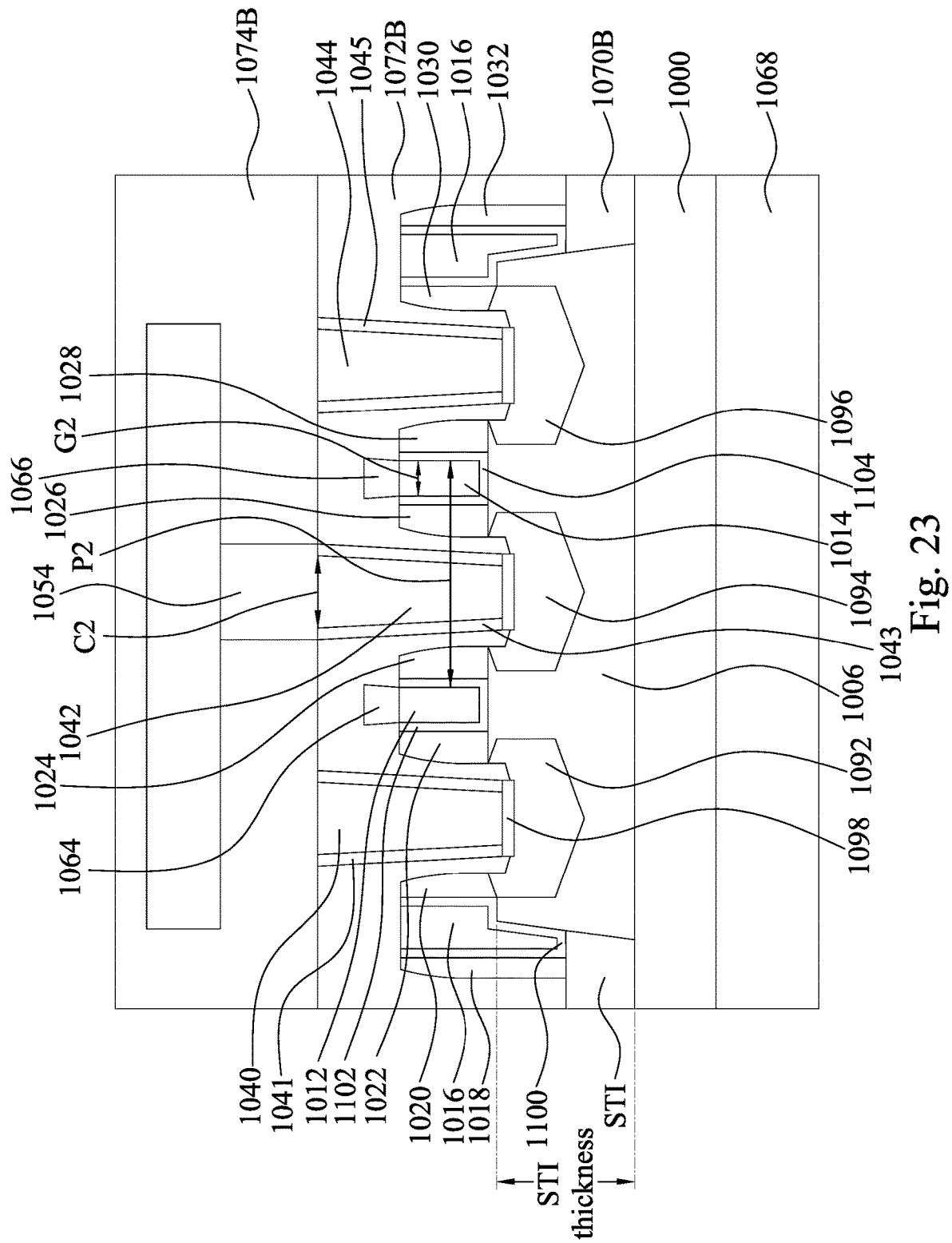
FIGS. 23 and 24 are cross-section views of the semiconductor device having the layout.
Figure 24:
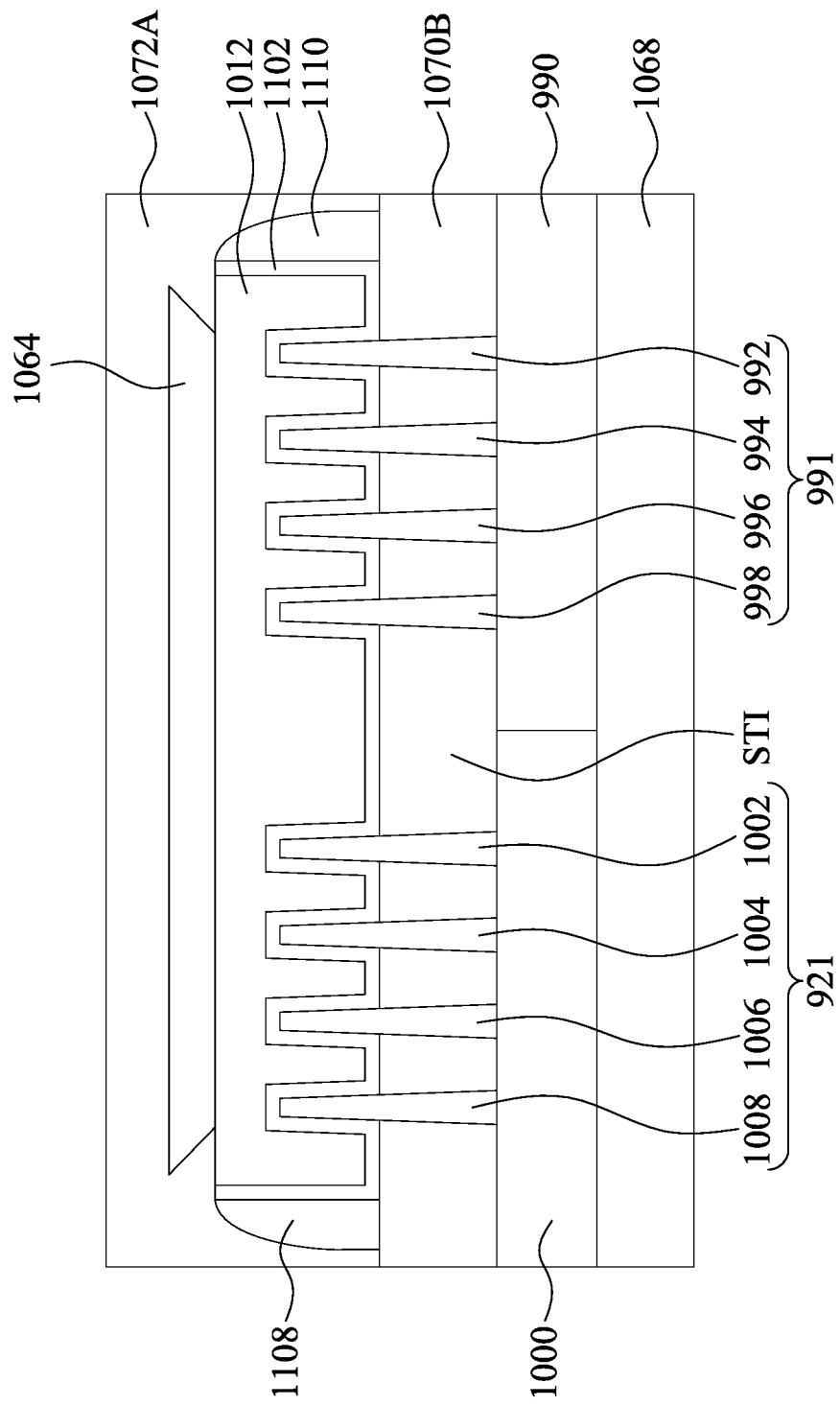

Reference is made to FIGS. 23 and 24. FIGS. 23 and 24 are cross-section views of the semiconductor device 900 having the layout 900A. The cross-section view in FIG. 23 is taken along line 23-23 in FIG. 20. The cross-section view in FIG. 24 is taken along line 24-24 in FIG. 20. The configuration of the semiconductor device 900 is described herein with respect to both FIG. 23 and FIG. 24.

Many aspects of the configurations of the semiconductor device 900 depicted in FIGS. 18 and 19 are the same as or similar to those of the semiconductor device 100 as depicted in FIGS. 7 and 8. For example, the semiconductor device 900 includes the substrate 1068, an isolation structure 1070B, second gate dielectric layers 1100, 1102, 1104, 1106, an ILD layer 1072B, spacers 1018, 1020, 1022, 1024, 1026, 1028, 1030, 1032, an IMD layer 1074B, source/drains 1092, 1094, 1096, and silicide regions 1098. For the sake of simplicity, the contact plugs are designated by the same reference numerals of the corresponding contact areas. For example, the contact plugs 1040, 1042, 1044 are respectively above the source/drains 1092, 1094, 1096 and are respectively surrounded by barrier layers 1041, 1043, 1045. Accordingly, the detailed explanation regarding these elements may be omitted. Different from the semiconductor device 100, in the example configuration in FIGS. 23 and 24, the semiconductor device 900 includes a gate contact 1064 above the gate electrode 1012 and a gate contact 1066 above the gate electrode 1014. The gate contacts 1064, 1066 are covered by the ILD layer 1072B. In some embodiments, example materials of the gate contacts 1064, 1066 include, but are not limited to, Ti, TiN, TaN, Co, Ru, Pt, W, Al, Cu. In some embodiments, the gate contact 1064 above the gate electrode 1012 is in contact with the gate electrode 1012, and a top surface of the gate contact 1064 is in a position lower than a position of a top surface of at least one of the contact plugs 1040, 1042, 1044. In some embodiments, the gate contact 1066 above the gate electrode 1014 is in contact with the gate electrode 1014, and a top surface of the gate contact 1066 is in a position lower than a position of the top surface of at least one of the contact plugs 1040, 1042, 1044. Furthermore, in the example configuration in FIG. 24, the gate contact 1064 is above the gate electrode 1012 and the fins 992-998 and 1002-1008.

The gate contacts 1064, 1066 in contact with the corresponding gate electrodes 1012, 1014 may be advantageous to reduce resistance of the gate electrodes 1012, 1014, so as to result in gate resistance reduction of the second circuit 904. Accordingly, the second circuit 904 is able to be used in high speed application. On the other hand, since the dimension differences between the first circuit 902 and the second circuit 904, the first circuit 902 can be used for high circuit density application. As such, with respect to the application of the semiconductor device 900, either high speed or high circuit density is achieved.

Figure 25:
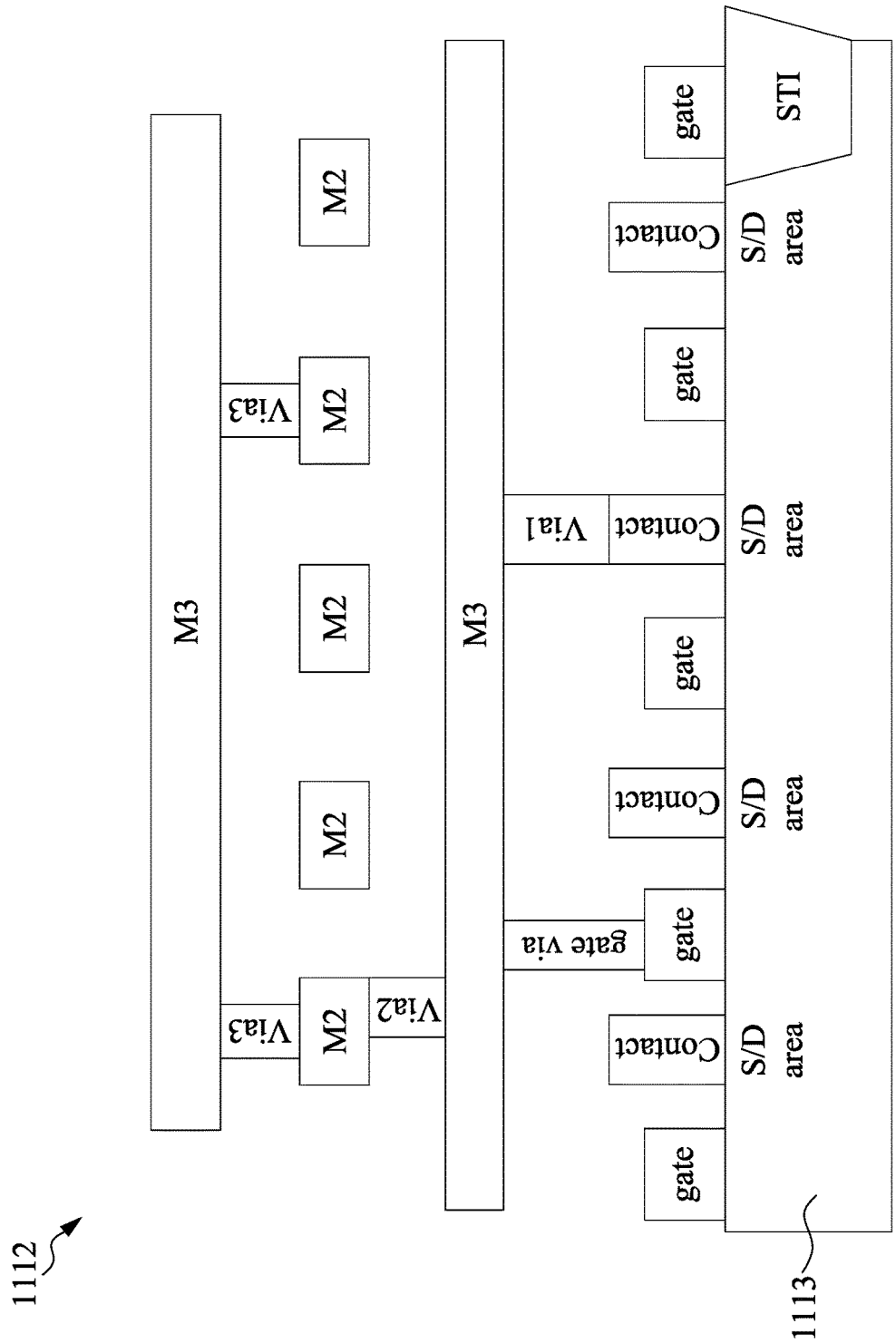
FIG. 25 is a diagrammatic fragmentary cross-sectional side view of a portion of an interconnect structure according to some embodiments of the present disclosure.

FIG. 25 is a diagrammatic fragmentary cross-sectional side view of a portion of an interconnect structure 1112 according to some embodiments of the present disclosure. The interconnect structure 1112 may be used to interconnect the elements of the semiconductor device 900 used in the first circuit 902 discussed above. As illustrated in FIG. 25, the interconnect structure 1112 above a substrate 1113 includes a plurality of metal layers, such as metal layers M1, M2, and M3. At least one solation structure such as shallow trench isolation (STI) is formed in the substrate 1113. A plurality of S/D areas (i.e., source/drain areas) are formed in the substrate 1113. A plurality of gates are formed over the substrate 1113. Contacts are formed over the substrate 1113 and over the S/D areas. A plurality of vias (such as gate via, via1, via2, via3) provide electrical connectivity between the metal layers and the gates (and other components such as source/drain).

Figure 26:
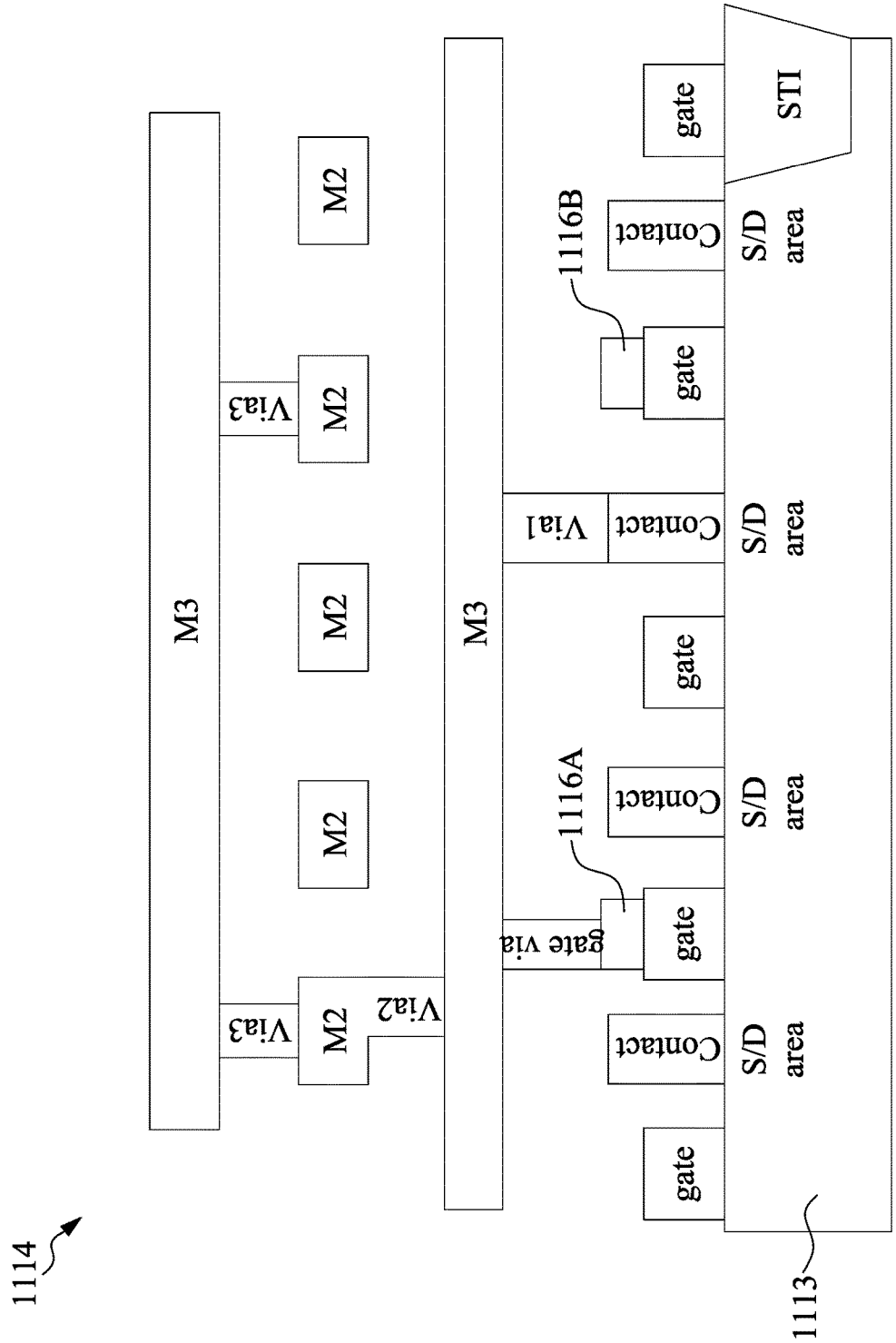
FIG. 26 is a diagrammatic fragmentary cross-sectional side view of a portion of an interconnect structure according to some embodiments of the present disclosure.

FIG. 26 is a diagrammatic fragmentary cross-sectional side view of a portion of an interconnect structure 1114 according to some embodiments of the present disclosure. The interconnect structure 1114 may be used to interconnect the elements of the semiconductor device 900 used in the second circuit 904 discussed above. As illustrated in FIG. 26, the interconnect structure 1114 above the substrate 1113 includes a plurality of metal layers, such as metal layers M1, M2, and M3. At least one solation structure such as shallow trench isolation (STI) is formed in the substrate 1113. A plurality of S/D areas (i.e., source/drain areas) are formed in the substrate 1113. A plurality of gates are formed over the substrate 1113. Contacts are formed over the substrate 1113 and over the S/D areas. A plurality of vias (such as gate via, via1, via2, via3) provide electrical connectivity between the metal layers and the gates (and other components such as source/drain). Furthermore, as depicted in FIGS. 23 and 24, gate contacts can be used for gate resistance reduction. For example, gate contacts 1116A, 1116B are formed on the gates. In some embodiments, the gate is electrically connected to the metal layer through at least one of the gate contacts. For example, the gate can be electrically coupled to the metal layer M1 through the gate contact 1116A and the via1. The gate contact 1116A is directly landed on the gate, and the via1 is in contact with the gate contact 1116A.

Figure 27:
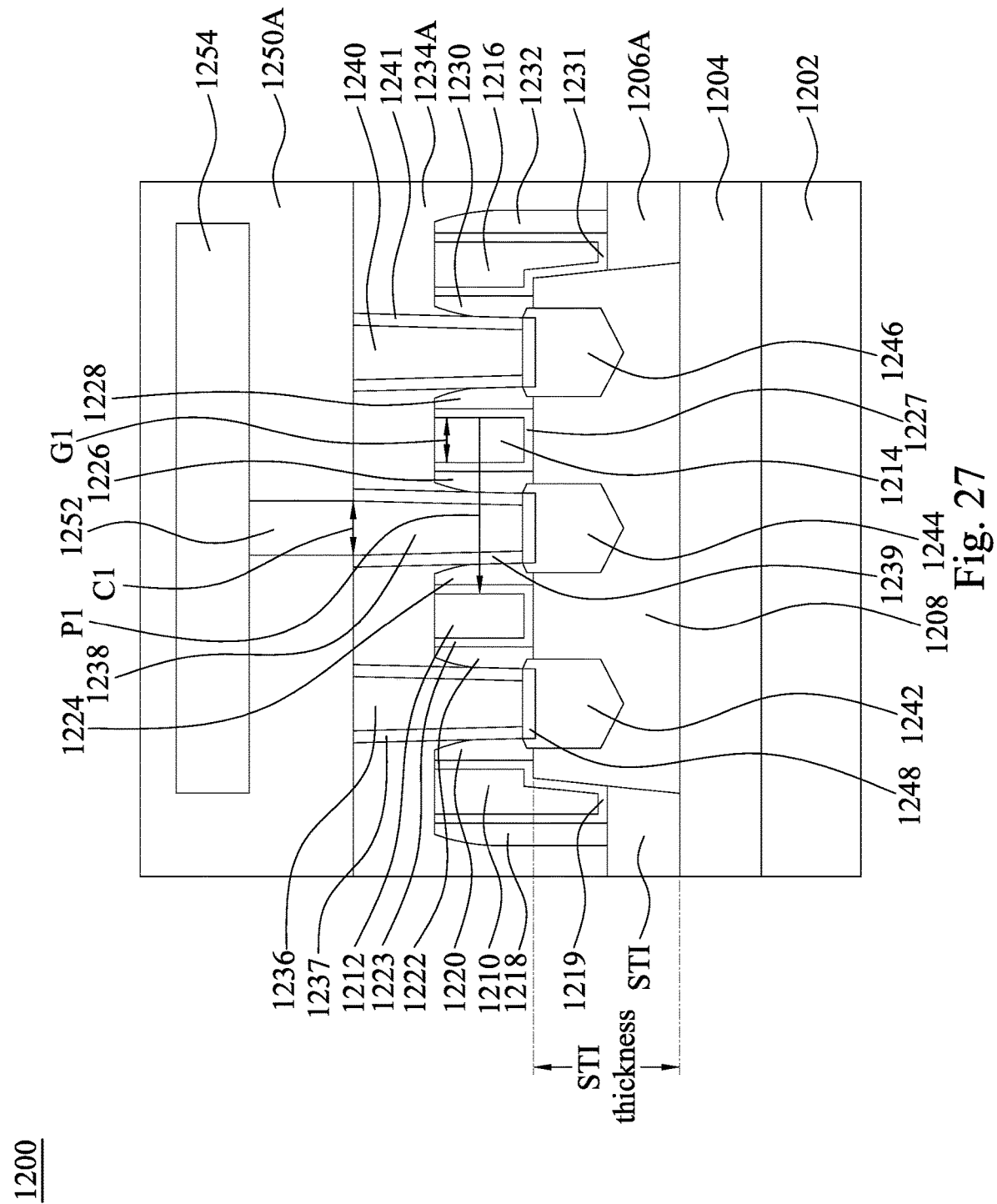
FIG. 27 is cross-section view of a semiconductor device.

Reference is made to FIG. 27. FIG. 27 is cross-section view of a semiconductor device 1200. Many aspects of the configurations of the semiconductor device 1200 depicted in FIG. 27 are the same as or similar to those of the semiconductor device 900 as depicted in FIG. 21, and the cross-section view in FIG. 27 is taken the same as the cross-section view in FIG. 21. For example, the semiconductor device 1200 includes a substrate 1202, a well region 1204, an isolation structure 1206A, a fin 1208, gate electrodes 1210, 1212, 1214, 1216, spacers 1218, 1220, 1222, 1224, 1226, 1228, 1230, 1232, first gate dielectric layers 1219, 1223, 1227, 1231, an ILD layer 1234A, contact plug 1236, 1238, 1240, barrier layers, 1237, 1239, 1241, source/drains 1242, 1244, 1246, silicide regions 1248, an IMD layer 1250A, S/D via 1252, and a conductive line 1254. Thus, the detailed explanation with respect to these elements may be omitted.

Figure 28:
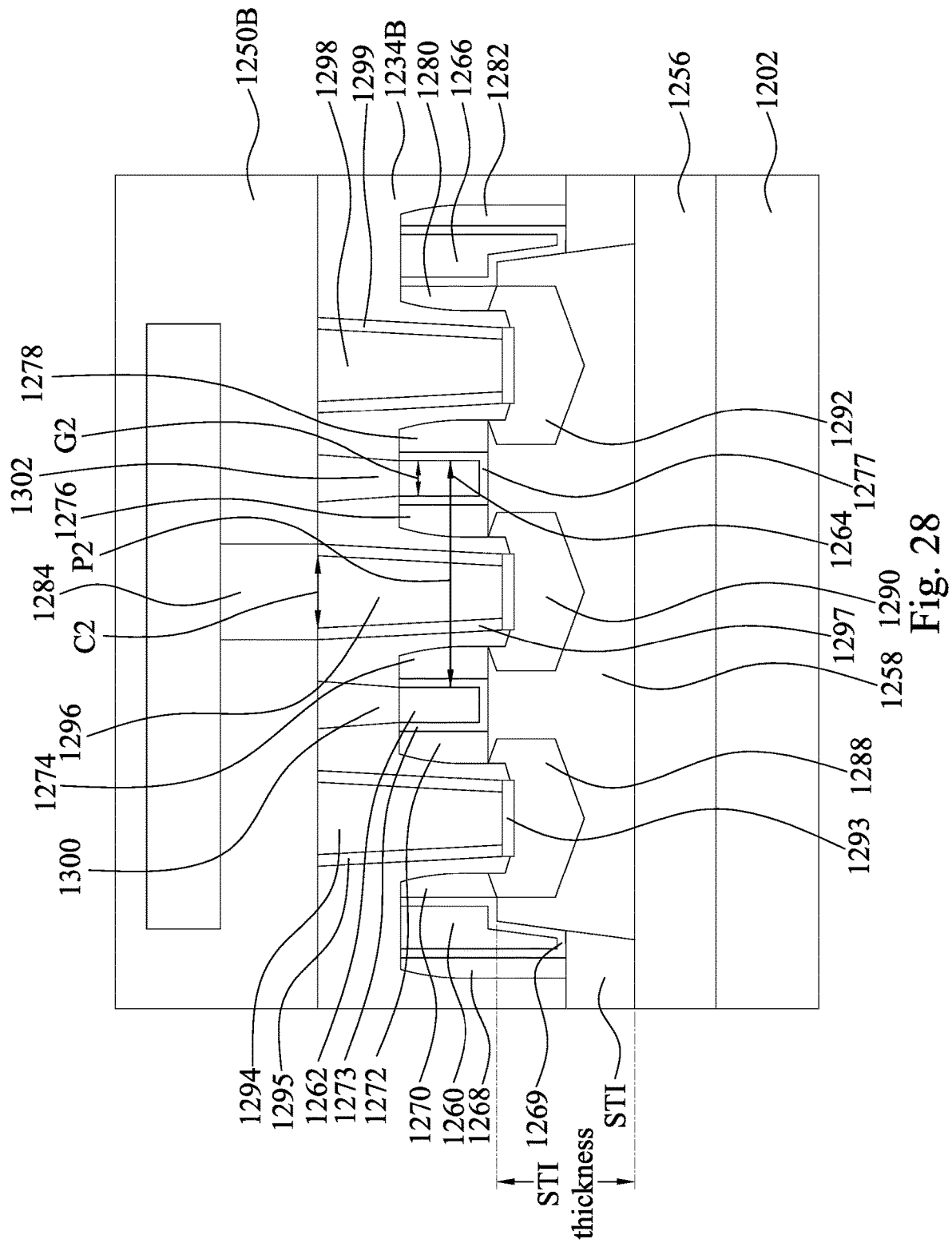
FIG. 28 is cross-section view of the semiconductor device.

Reference is made to FIG. 28. FIG. 28 is cross-section view of the semiconductor device 1200. Many aspects of the configurations of the semiconductor device 1200 depicted in FIG. 28 are the same as or similar to those of the semiconductor device 900 as depicted in FIG. 23, and the cross-section view in FIG. 28 is taken as the same as the cross-section view in FIG. 23. For example, the semiconductor device 1200 includes the substrate 1202, a well region 1256, an isolation structure 1206B, a fin 1258, gate electrodes 1260, 1262, 1264, 1266, spacers 1268, 1270, 1272, 1274, 1276, 1278, 1280, 1282, second gate dielectric layers 1269, 1273, 1277, 1281, an ILD layer 1234B, contact plug 1294, 1296, 1298, barrier layers, 1295, 1297, 1299, source/drains 1288, 1290, 1292, silicide regions 1293, an IMD layer 1250B, S/D via 1284, and a conductive line 1286, and a plurality of gate contacts 1300, 1302. Thus, the detailed explanation with respect to these elements may be omitted. Different from the semiconductor device 900 as depicted in FIG. 23, the semiconductor device 1200 depicted in FIG. 23 includes gate contact 1300, 1302 in contact with the IMD layer 1250B. In the example configuration in FIG. 23, the gate contact 1300 is above and in contact with the gate electrode 1262, and the gate contact 1302 is above and in contact with the gate electrode 1264. The gate contacts 1064, 1066 are surrounded by the ILD layer 1234B. In some embodiments, example materials of the gate contacts 1300, 1302 include, but are not limited to, Ti, TiN, TaN, Co, Ru, Pt, W, Al, Cu. In some embodiments, the gate contacts 1300, 1302 have the same material as the contact plug 1294, 1296, 1298. For example, the gate contacts 1300, 1302 and the contact plug 1294, 1296, 1298 may be made of Co. In some embodiments, top surfaces of the gate contacts 1300, 1302 are substantially coplanar with top surfaces of the contact plug 1294, 1296, 1298. In some embodiments, the gate contacts 1300, 1302 may be configured to electrically couple to the corresponding gate electrodes 1262, 1264 to other circuitry.

The gate contacts 1300, 1302 in contact with the corresponding gate electrodes 1262, 1264 may be advantageous to reduce resistance of the gate electrodes 1012, 1014, so as to result in gate resistance reduction of the circuit used in the semiconductor device 1200. On the other hand, dimension parameters of the semiconductor device 1200 can be the same as or similar to the dimension parameters depicted in FIGS. 19 and 20. As such, with respect to the application of the semiconductor device 1200, either high speed or high circuit density is achieved.

The fins, gate electrodes, gate spacers, contact plugs and/or vias can be modelled in corresponding layouts as discussed above. These layouts are represented by a plurality of masks generated by one or more processors and/or stored in one or more non-transitory computer-readable media. Other formats for representing the layout are within the scope of various embodiments. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

As described above, the first circuit and the second circuit can be used in the semiconductor device. Some of the dimension parameters of the first circuit are different from those of the second circuit. The dimension differences may be advantageous to provide various applications or functions for different circuits. For example, the S/D vias of the second circuit have the second contact area greater than the first contact area of the S/D vias of the first circuit, and thus resistance reduction of the second circuit is achieved. Accordingly, the second circuit is able to be used in high speed application, such as a SerDes circuit. Moreover, the dimension differences may be advantageous to achieve high circuit density of the first circuit. As such, with respect to the application of the semiconductor device, either high speed or high circuit density is achieved.

According to various embodiments of the present disclosure, an IC structure includes first and second semiconductor fins extending along a first direction; first and second gate electrodes respectively extending across channel regions of the first and second semiconductor fins along a second direction perpendicular to the first direction; first and second source/drain contacts extending across source/drain regions of the first and second semiconductor fins, respectively; and first source/drain via over the first source/drain contact, wherein a width of the second source/drain contact measured along the first direction is greater than a diameter of the first source/drain via.

According to various embodiments of the present disclosure, an IC structure includes a first circuit comprising a plurality of first semiconductor fins, a plurality of first gate electrodes extending across the plurality of first semiconductor fins, a plurality of first gate spacers respectively surrounding the plurality of first gate electrodes from a top view, and a plurality of first source/drain contacts alternately arranged with the plurality of first gate spacers along lengthwise directions of the plurality of first semiconductor fins; and a second circuit comprising a plurality of second semiconductor fins, a plurality of second gate electrodes extending across the plurality of second semiconductor fins, a plurality of second gate spacers respectively surrounding the plurality of second gate electrodes from the top view, and a plurality of second source/drain contacts alternately arranged with the plurality of second gate spacers along lengthwise directions of the plurality of second semiconductor fins. The plurality of second source/drain contacts are spaced apart from each of the second gate spacers, but each of the plurality of first source/drain contacts is in contact with two of the plurality of first gate spacers.

According to various embodiments of the present disclosure, an IC structure includes a first circuit comprising a plurality of first semiconductor fins, a first gate electrode extending across channel regions of the plurality of first semiconductor fins, a first source/drain contact extending across source/drain regions of the plurality of first semiconductor fins, a first gate via over the first gate electrode, and a first source/drain via over the first source/drain contact; and a second circuit comprising a plurality of second semiconductor fins, a second gate electrode extending across channel regions of the plurality of second semiconductor fins, a second source/drain contact extending across source/drain regions of the plurality of second semiconductor fins, a second gate via over the second gate electrode, and a second source/drain via over the second source/drain contact. From a top view an area ratio of the second source/drain via to the second gate via is larger than an area ratio of the first source/drain via to the first gate via.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC) structure, comprising:
   a plurality of first fins and a plurality of second fins over a substrate;
   a plurality of first gate structures traversing the plurality of first fins;
   a plurality of second gate structures traversing the plurality of second fins, the plurality of first gate structures having a first gate pitch, the plurality of second gate structures having a second gate pitch wider than the first gate pitch; and
   a first gate contact over a first one of the plurality of second gate structures, the first gate contact overlapping a location where the first one of the plurality of second gate structures traverses across a first one of the plurality of second fins, wherein the first gate contact further overlaps a location where the first one of the plurality of second gate structures traverses across a second one of the plurality of second fins.

2. The IC structure of claim 1, wherein the first gate contact has an oval profile from a top view.

3. The IC structure of claim 1, further comprising:
   a source/drain contact extending across source/drain regions of the plurality of second fins, the source/drain contact having a longitudinal axis parallel with a longitudinal axis of the first gate contact.

4. The IC structure of claim 3, wherein the source/drain contact has a different profile than the first gate contact from a top view.

5. The IC structure of claim 3, wherein the first gate contact is more curved than the source/drain contact from a top view.

6. The IC structure of claim 3, wherein the first gate contact has a greater length than the source/drain contact from a top view.

7. The IC structure of claim 1, further comprising:
   a second gate contact over a second one of the plurality of second gate structures, the second gate contact overlapping a location where the second one of the plurality of second gate structures traverses across the first one of the plurality of second fins.

8. The IC structure of claim 7, wherein the second gate contact further overlaps a location where the second one of the plurality of second gate structures traverses across a second one of the plurality of second fins.

9. The IC structure of claim 1, further comprising:
a gate via overlapping the first gate contact at a fin-free location.

10. An IC structure, comprising:
a plurality of semiconductor fins extending along a first direction over a substrate;
a first gate structure extending along a second direction across the plurality of semiconductor fins, the second direction being different from the first direction; and
a first gate contact over the first gate structure, the first gate contact extending along the second direction across the plurality of semiconductor fins.

11. The IC structure of claim 10, wherein the first gate contact has an elliptical top-view profile.

12. The IC structure of claim 10, further comprising:
a source/drain contact laterally spaced apart from the first gate structure, the source/drain contact extending along the second direction across the plurality of semiconductor fins.

13. The IC structure of claim 12, wherein the source/drain contact has a different shape than the first gate contact when viewed in a top view.

14. The IC structure of claim 10, further comprising:
a second gate structure extending along the second direction across the plurality of semiconductor fins; and
a second gate contact over the second gate structure, the second gate contact extending along the second direction across the plurality of semiconductor fins.

15. The IC structure of claim 14, wherein the second gate contact has an elliptical top-view profile.

16. An IC structure, comprising:
a plurality of semiconductor fins extending along a first direction;
a first gate structure extending along a second direction across the plurality of semiconductor fins, the second direction being non-parallel to the first direction; and
a plurality of first gate vias arranged on the first gate structure in a spaced-apart manner, the plurality of first gate vias respectively overlapping the plurality of semiconductor fins.

17. The IC structure of claim 16, wherein from a top view, one of the plurality of first gate vias has a largest dimension greater than a fin width of one of the plural semiconductor fins.

18. The IC structure of claim 16, further comprising:
a second gate structure extending along the second direction across the plurality of semiconductor fins;
a source/drain contact laterally between the first gate structure and the second gate structure; and
a plurality of second gate vias arranged on the second gate structure in a spaced-apart manner, the plurality of second gate vias respectively overlapping the plurality of semiconductor fins.

19. The IC structure of claim 18, wherein the source/drain contact has a top-view area greater than a top-view area of one of the plurality of first gate vias and the plurality of second gate vias.

20. The IC structure of claim 1, further comprising:
a gate via over the first gate contact.

* * * * *